(12) United States Patent
Schultz

(10) Patent No.: US 11,742,289 B2
(45) Date of Patent: *Aug. 29, 2023

(54) SEMICONDUCTOR CHIP WITH STACKED CONDUCTOR LINES AND AIR GAPS

(71) Applicant: ADVANCED MICRO DEVICES, INC., Santa Clara, CA (US)

(72) Inventor: Richard Schultz, Fort Collins, CO (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/317,510

(22) Filed: May 11, 2021

(65) Prior Publication Data
US 2021/0296233 A1    Sep. 23, 2021

Related U.S. Application Data

(63) Continuation of application No. 16/382,774, filed on Apr. 12, 2019, now Pat. No. 11,004,791.

(51) Int. Cl.
| | | |
|---|---|---|
| *H01L 23/528* | (2006.01) | |
| *H01L 21/768* | (2006.01) | |
| *H01L 23/522* | (2006.01) | |
| *H01L 23/532* | (2006.01) | |

(52) U.S. Cl.
CPC ...... *H01L 23/5283* (2013.01); *H01L 21/7682* (2013.01); *H01L 21/76816* (2013.01); *H01L 21/76835* (2013.01); *H01L 23/5226* (2013.01); *H01L 23/53295* (2013.01); *H01L 21/76843* (2013.01)

(58) Field of Classification Search
CPC ............ H01L 21/7682; H01L 23/5226; H01L 23/53295; H01L 21/76843; H01L 23/5283; H01L 21/76816
See application file for complete search history.

(56) References Cited

U.S. PATENT DOCUMENTS

| | | |
|---|---|---|
| 5,882,996 A | 3/1999 | Dai |
| 6,653,726 B1 | 11/2003 | Schultz et al. |
| 11,004,791 B2 * | 5/2021 | Schultz ............ H01L 21/76835 |
| 2007/0284744 A1 | 12/2007 | Dubin et al. |
| 2008/0048326 A1 | 2/2008 | Han |

(Continued)

OTHER PUBLICATIONS

De Orio, "Dual-Damascene Fabrication Process," www.iue.tuwien.ac.at/phd/orio/node10.html, Mar. 4, 2019, 2 pages.

(Continued)

*Primary Examiner* — Jasmine J Clark

(57) ABSTRACT

Various semiconductor chip metallization layers and methods of manufacturing the same are disclosed. In aspect, a semiconductor chip is provided that includes a substrate, plural metallization layers on the substrate, a first conductor line in one of the metallization layers and a second conductor line in the one of the metallization layers in spaced apart relation to the first conductor line, each of the first conductor line and the second conductor line has a first line portion and a second line portion stacked on the first line portion, and a dielectric layer that has a portion positioned between the first conductor line and a second line, the portion has an air gap.

20 Claims, 15 Drawing Sheets

(56) References Cited

U.S. PATENT DOCUMENTS

| | | |
|---|---|---|
| 2009/0152726 A1 | 6/2009 | Choi |
| 2011/0163446 A1 | 7/2011 | Nitta et al. |
| 2012/0126413 A1 | 5/2012 | Braeckelmann et al. |
| 2012/0280398 A1 | 11/2012 | Clevenger et al. |
| 2013/0214413 A1 | 8/2013 | Lee et al. |
| 2014/0015137 A1 | 1/2014 | Park et al. |
| 2015/0137378 A1 | 5/2015 | Wu et al. |
| 2017/0330790 A1 | 11/2017 | He et al. |
| 2020/0066629 A1 | 2/2020 | Schenker et al. |

OTHER PUBLICATIONS

International Search Report and Written Opinion, PCT/US2020/025568, dated Jul. 17, 2020, 12 pages.
Lapedus, "What Will Replace Dual Damascene?" Semiconductor Engineering; Jan. 24, 2013, 6 pages.
Penta, "Damascene Process—An Overview; Science Direct Topics," www.sciencedirect.com/topics/engineering/damascene-process, 2016, 17 pages.
Extended European Search Report, EP Application No. 20787545.1, Jan. 4, 2023, 8 pages.

\* cited by examiner

SEMICONDUCTOR CHIP WITH STACKED CONDUCTOR LINES AND AIR GAPS

BACKGROUND OF THE INVENTION

Currently-available integrated circuits routinely contain millions of individual transistors and other electronic components. Most of the interconnections for the numerous components in such circuits are provided via one or more metallization layers that serve as global interconnect levels. In one conventional subtractive process, each metallization layer is ordinarily deposited on the substrate of the integrated circuit as a single continuous layer that is thereafter patterned lithographically and etched to remove metal from areas where metal lines are not required. In another process, a dual damascene procedure is used.

In multi-layer metallization circuits, individual metal layers are typically separated vertically by one or more interlevel dielectric layers (ILD). Electrical contact between the adjacent metal layers is provided by openings or vias in the ILD. The vias are typically formed by masking and subsequent etching of selected portions of the ILD. The vias are then filled with a conductor material or sometimes combinations of conducting materials. The term "via" as used in semiconductor fabrication circles has come to mean not only the openings themselves, but also the openings filled with conducting material.

As spacing between conductor lines in a metallization shrink, the capacitance between such adjacent lines increases, with an attendant penalty in performance due to capacitive delay. One conventional technique used to combat capacitive increase due to decreased line spacing is the usage of air gaps between adjacent lines. Single layer conductor lines are constructed with a gap that is filled with a dielectric material. As the dielectric material is deposited by chemical vapor deposition, the opposing walls of the adjacent lines become coated with dielectric. Eventually, the dielectric material bridges over, leaving an air gap in the dielectric between the lines.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
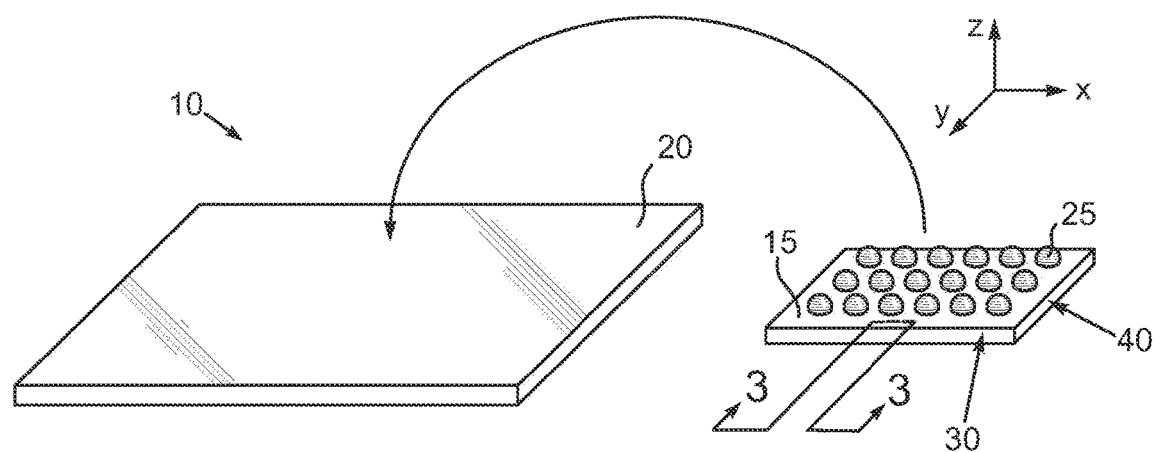
FIG. 1 is a partially exploded pictorial view of an exemplary semiconductor chip device arrangement.

The disclosed arrangements provide semiconductor chip metallization that utilize air gaps in interlevel dielectric layers between adjacent conductor lines to counteract the capacitance increase associated with reduced line spacing. However, to further improve electrical performance with tighter line spacing, the disclosed techniques utilize conductor wires composed of stacked lines. Each adjacent line separated by an air gap is constructed from a first line and a second line stacked on the first line. The processing can be incorporated directly into well-known double damascening metallization processes to provide for via interconnects. In this way, conductor lines with higher aspect ratios than that permitted by conventional techniques can be constructed and without the need to attempt to resort to extremely difficult very high aspect ratio deep trench etching techniques. Existing types of barrier layers and materials can be used. Significant resistance reduction and trade off with capacitance can be achieved. With lower resistance, the number of lines necessary for routing other things can be reduced and this can improve the routing congestion timings and chip area consumed. The disclosed arrangements provide for better electromigration and power droop performance and can reduce output driver sensitivity to conductor wire resistance.

In accordance with one aspect of the present invention, a semiconductor chip is provided that includes a substrate, plural metallization layers on the substrate, a first conductor line in one of the metallization layers and a second conductor line in the one of the metallization layers in spaced apart relation to the first conductor line, each of the first conductor line and the second conductor line has a first line portion and a second line portion stacked on the first line portion, and a dielectric layer that has a portion positioned between the first conductor line and a second line, the portion has an air gap.

The semiconductor chip wherein a third conductor line of the one of the metallization layers comprises a first line portion and a second line portion stacked on the first line portion, the one of the metallization layers has a conductive via, the first line portion and the conductive via have a shared contiguous bulk conductor portion and a shared contiguous barrier layer.

The semiconductor chip wherein the second line portion has a first thickness and the air gap has a second thickness greater than the first thickness.

The semiconductor chip comprising plural conductor lines in another of the metallization layers, each of the of plural conductor lines has a first thickness, the first conductor line of the one metallization layer has a second thickness greater than the first thickness.

The semiconductor chip comprising plural conductive vias in another of the metallization layers, each of the of plural conductive vias has a first thickness, a third conductor line of the one of the metallization layers comprises a first line portion and a second line portion stacked c the first line portion, the one of the metallization layers has a conductive via connected to the first line portion, the conductive via has a second thickness greater than the first thickness.

The semiconductor chip wherein the one of the metallization layers comprises a first dielectric layer and a second dielectric layer stacked on the first dielectric layer, the each of the first conductor line and the second conductor line being positioned partially in the first dielectric layer and partially in the second dielectric layer.

The semiconductor chip comprising plural conductor lines in another of the metallization layers, the plural conductor lines have a first lateral spacing, the first conductor line and the second conductor line of the one metallization layer have a second lateral spacing smaller than the first lateral spacing.

The semiconductor chip comprising a circuit board, the semiconductor chip being mounted on the circuit board.

In accordance with another aspect of the present invention, a semiconductor chip is provided that includes a substrate, a first metallization layer on the substrate and a second metallization layer an the first metallization layer, plural conductor lines in the first metallization layer, each of the conductor lines has an aspect ratio, a first conductor line in the second metallization layer and a second conductor line in the second metallization layer in spaced apart relation to the first conductor line, each of the first conductor line and the second conductor line has a first line portion and a second line portion stacked on the first line portion, each of the first conductor line and the second conductor line has an aspect ratio greater than the aspect ratios of the plural conductor lines, and a dielectric layer that has a portion positioned between the first conductor line and a second line, the portion has an air gap.

The semiconductor chip wherein a third conductor line of the second metallization layer comprises a first line portion and a second line portion stacked on the first line portion, the second metallization layer has a conductive via, the first line portion and the conductive via have a shared contiguous bulk conductor portion and a shared contiguous barrier layer.

The semiconductor chip comprising plural conductive vias in first metallization layer, each of the of plural conductive vias has a first thickness, a third conductor line of the second metallization layer comprises a first line portion and a second line portion stacked on the first line portion, the second metallization layer has a conductive via connected to the first line portion, the conductive via has a second thickness greater than the first thickness.

The semiconductor chip wherein the second metallization layer comprises a first dielectric layer and a second dielectric layer stacked on the first dielectric layer, each of the first conductor line and the second conductor line being positioned partially in the first dielectric layer and partially in the second dielectric layer.

The semiconductor chip wherein the plural conductor lines have a first lateral spacing, the first conductor line and the second conductor line of the second metallization layer have a second lateral spacing smaller than the first lateral spacing.

The semiconductor chip comprising a circuit board, the semiconductor chip being mounted on the circuit board.

In accordance with another aspect of the present invention, a method of manufacturing a semiconductor chip is provided. The method includes fabricating plural metallization layers on a substrate, fabricating a first conductor line in one of the metallization layers and a second conductor line in the one of the metallization layers in spaced apart relation to the first conductor line, each of the first conductor line and the second conductor line has a first line portion and a second line portion stacked on the first line portion, and fabricating a dielectric layer that has a portion positioned between the first conductor line and a second line, the portion has an air gap.

The method comprising fabricating a third conductor line in the one of the metallization layers with a first line portion and a second line portion stacked on the first line portion, and fabricating a conductive via in the one of metallization layers, the first line portion and the conductive via have a shared contiguous bulk conductor portion and a shared contiguous barrier layer.

The method wherein the second line portion has a first thickness and the air gap has a second thickness greater than the first thickness.

The method comprising fabricating plural conductor lines in another of the metallization layers, each of the of plural conductor lines has a first thickness, the first conductor line of the one metallization layer has a second thickness greater than the first thickness.

The method comprising fabricating plural conductive vias in another of the metallization layers, each of the of plural conductive vias has a first thickness, and fabricating a third conductor line of the one of the metallization layers with a first line portion and a second line portion stacked on the first line portion, the one of the metallization layers has a conductive via connected to the first line portion, the conductive via has a second thickness greater than the first thickness.

The method wherein the one of the metallization layers comprises a first dielectric layer and a second dielectric layer stacked on the first dielectric layer, each of the first conductor line and the second conductor line being positioned partially in the first dielectric layer and partially in the second dielectric layer.

The method comprising fabricating plural conductor lines in another of the metallization layers, the plural conductor lines have a first lateral spacing, the first conductor line and the second conductor line of the one metallization layer have a second lateral spacing smaller than the first lateral spacing.

The method comprising mounting the semiconductor chip on a circuit board.

In the description described below, reference numerals are generally repeated where identical elements appear in more than one figure. Turning now to the drawings, and in particular to FIG. 1, therein is shown a partially exploded pictorial view of an exemplary embodiment of a semiconductor chip device 10 that includes a semiconductor chip 15 that can be mounted on a circuit board 20. The semiconductor chip 15 is shown exploded from the circuit board. The semiconductor chip 15 includes multiple interconnect structures 25, which are designed to metallurgically bond to the circuit board 20 and form plural joints or other types of solder connections when the semiconductor chip 15 is mounted to the circuit board 20. Two edges 30 and 40 of the semiconductor chip 15 are visible in FIG. 1.

The exemplary arrangements disclosed herein air not reliant on particular functionalities of the semiconductor chip 15 or the circuit board 20. Thus, the semiconductor chip 15 may be any of a variety of different types of circuit devices used in electronics, such as, for example, interposers, microprocessors, graphics processors, combined microprocessor/graphics processors, application specific integrated circuits, memory devices or the like, and may be single or multi-core. The semiconductor chip 15 may be constructed of bulk semiconductor, such as silicon or germanium, or semiconductor-on-insulator materials, such as silicon-on-insulator materials or even insulator materials. Thus, the term "semiconductor chip" even contemplates insulating materials. Stacked dice may be used if desired.

The circuit board 20 can be another semiconductor chip of the type described above, a semiconductor chip package substrate, a circuit card, or virtually any other type of printed circuit board. Monolithic or laminate structures could be used. A build up design is one example of a laminate. In this regard, the circuit board 20 can consist of a central core upon which one or more build-up layers are formed and below which an additional one or more build-up layers air formed. The core itself can consist of a stack of one or more layers. So-called "coreless" designs may be used as well. The layers of the circuit board 20 can consist of an insulating material, such as various well-known epoxies or other resins interspersed with metal interconnects. A multi-layer configuration other than buildup could be used. Optionally, the circuit board 20 can be composed of well-known ceramics or other materials suitable for package substrates or other printed circuit boards.

Figure 2:
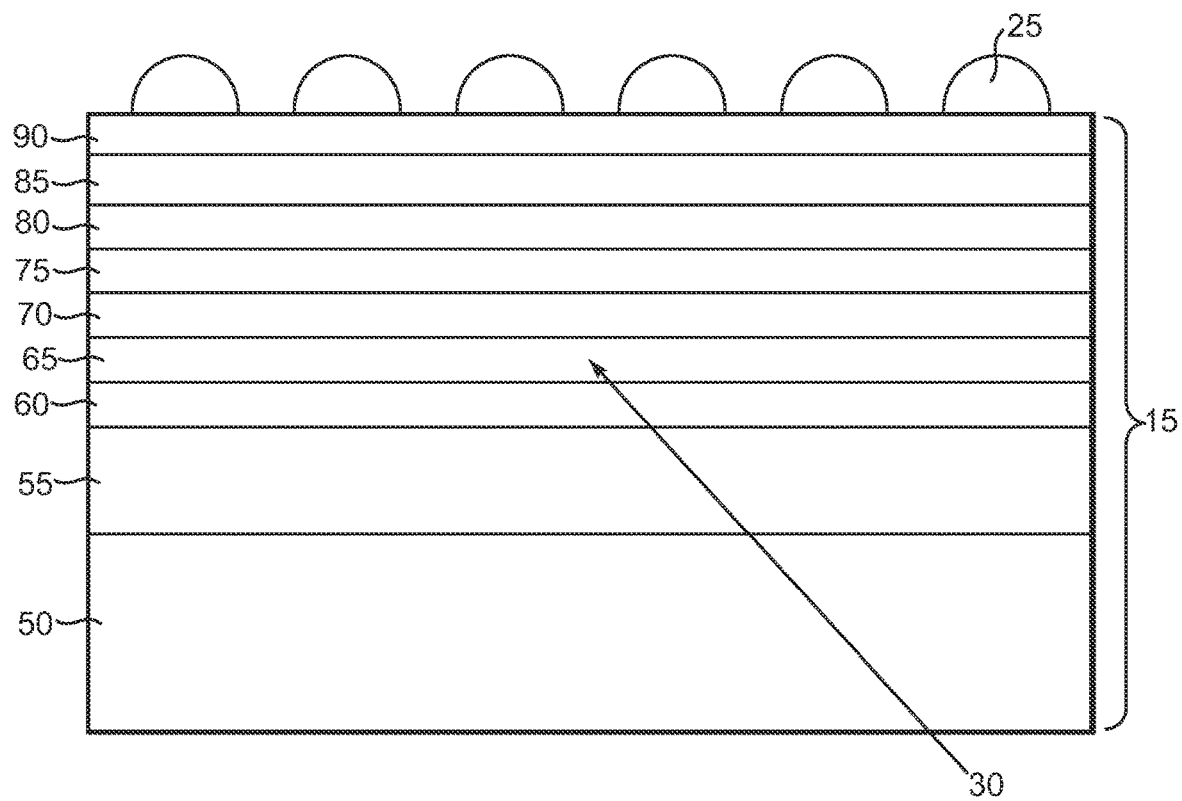
FIG. 2 is a side orthogonal view of the semiconductor chip in FIG. 1.

Additional details of semiconductor chip 15 can be understood by referring now to FIG. 2, which is an orthogonal view of the side 30 of the semiconductor chip 15 blown up. As shown in FIG. 2, the semiconductor chip 15 includes a substrate or bulk semiconductor layer 50, a device layer 55 positioned on the bulk layer 50 and plural metallization layers 60, 65, 70, 75, 80, 85 and 90. As described in more detail below, each of the metallization layers includes a layer of metallization traces interspersed within an interlevel dielectric layer (ILD) and interconnected vertically with an adjacent metallization layer by way of conductive vias. In this illustrative arrangement, there are seven metallization layers 60, 65, 70, 75, 80, 85 and 90 depicted. However the skilled artisan will appreciate that the number of metallization layers can be other than seven.

Figure 3:
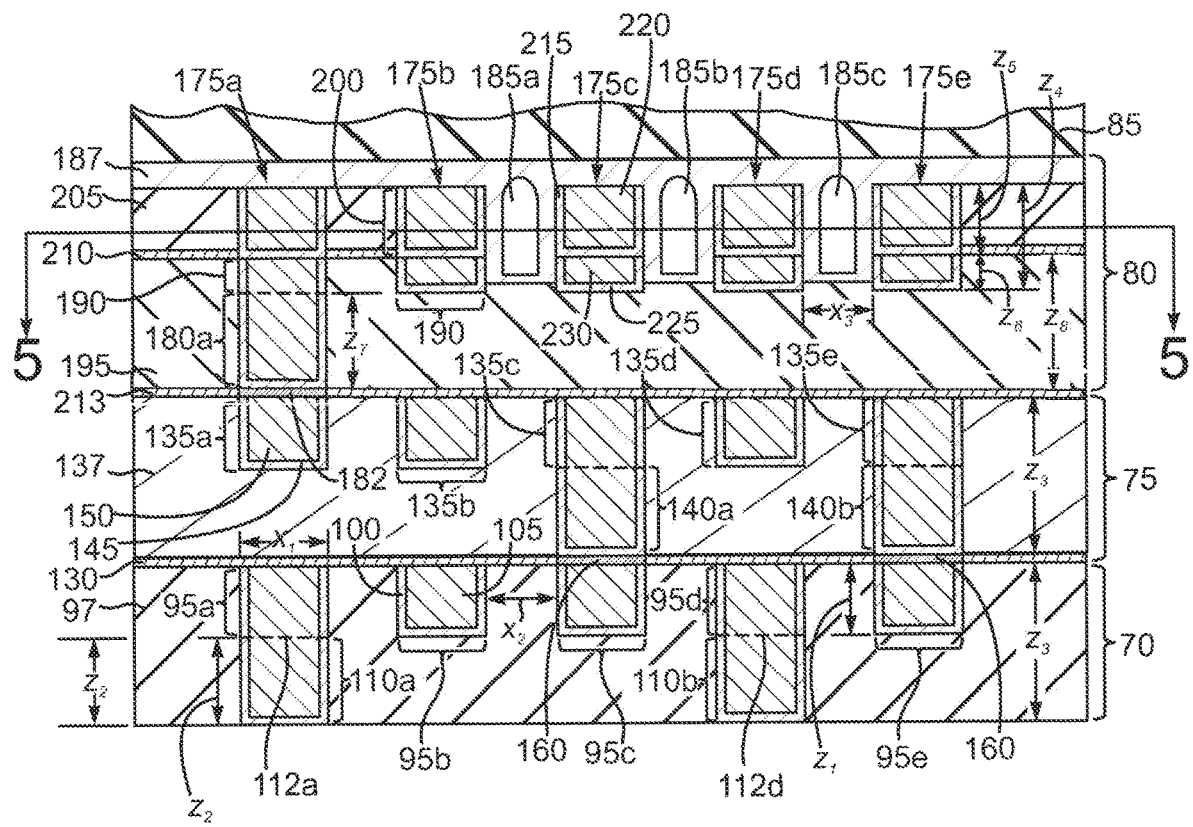
FIG. 3 is a sectional view of FIG. 1 taken at section 3-3.
Figure 4:
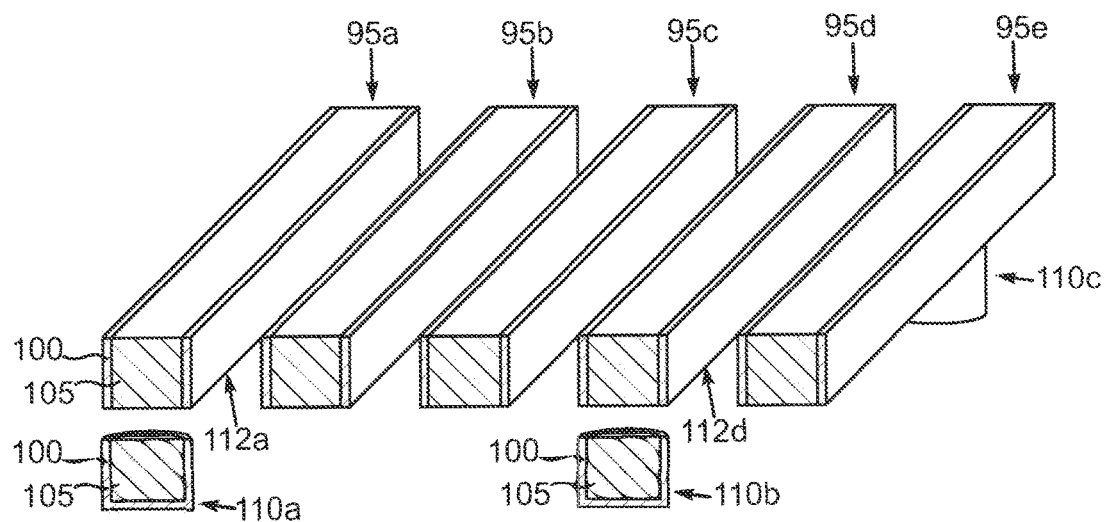
FIG. 4 is a pictorial view of some exemplary conductor lines exploded from a metallization layer.

Additional details of the semiconductor chip 15 can be understood by referring now also to FIG. 3, which is a sectional view of FIG. 1 taken at section 3-3 and to FIG. 4, which is a partially exploded pictorial view of some of the conductors in the metallization layer 70. Note that because of the location and size of the cutting plane for section 3-3, only a very small portion of the semiconductor chip 15 is depicted in FIG. 3, and indeed the focus in FIG. 3 will be on only a sub-set of the metallization layers 60, 65, 70, 75, 80, 85 and 90 and in particular metallization layers 70, 75, 80 and 85. Note that only a portion of the metallization layer 85 is depicted in FIG. 3. Attention is turned first to the metallization layer 70. The metallization layer 70 includes plural conductor lines 95a, 95b, 95c, 95d and 95e (and others not visible) interspersed in an ILD 97. While only a few conductor lines 95a, 95b, 95c, 95d and 95e are depicted, it should be understood that the metallization layer 70 and any of the other metallization layers 60, 75, 80, 85 and 90 can be much more numerous than what is shown in the figures. Each of the conductor lines 95a, 95b, 95c, 95d and 95e consists of a barrier layer 100 and a bulk conductor 105 and is fabricated with some typical line width $x_1$ and a typical spacing $x_2$. The barrier layer 100 is designed to prevent movement of metal ions and other impurities. Some or all of the conductor lines 95a, 95b, 95c, 95d and 95e are interconnected with the next metallization layer below (in this case layer 65 shown in FIG. 2) by way of plural vias, two of which are visible in FIGS. 3 and 4 and labeled 110a and 110b, respectively, and another via 11 Oc visible in FIG. 4. The vias 11 Oa, 11 Ob and 11 Oc can be much more numerous than what is shown in the figures. The vias 11 Oa, 11 Ob and 11 Oc are preferably constructed using a double damascene process such that, in reality, the barrier layer 100 and the bulk conductor of the via 110a is contiguous with the barrier layer 100 and bulk conductor 105 of the line 95a, and so on for the via 11 Ob relative to the line 95d and the via 110c relative to the line 95e. The vias 110a, 11 Ob and 11 Oc can be cylindrical, square or other footprint. The vias 110a and 11 Ob are shown hypothetically exploded from the lower sides 112a and 112d of the lines 95a and 95d, respectively, in FIG. 4 to show this cylindrical shape arrangement in FIG. 4. Note that lower sides 112a and 112d are not visible in FIG. 3 and thus shown in phantom. The barrier layers 100 can be composed of Ti, TiN, Ta, TaN, Ta, Ru, Co or the like and laminates of these or the like. The bulk conductors 105 can be composed of copper, silver, aluminum, platinum, gold, palladium, Co, Ru, combinations or laminates of these or other conductor materials as desired. Well-known material deposition processes can be used such as plating, chemical vapor deposition, physical vapor deposition or others. The ILD 97 can be composed of a variety of interlevel dielectric materials, such as tetra-ethyl-orthosilicate, various other glasses, or so-called "low-K" materials with a K value less than about 3.0 or "ultra low-K" materials with a K value less than about 2.7 that both favor reduced parasitics between displaced conductor layers. Exemplary materials include, for example, porous carbon doped oxides (p-SiCOH), nano porous organosilicate and black diamond film. The other conductor lines and ILDs disclosed herein can be made from the same materials.

The conductor lines 95a, 95b, 95c and 95d are fabricated with some desired thickness $z_1$, the vias 110a and 11 Ob are fabricated with some desired height Zz and the ILD 97 is fabricated before both the vias 110a and 11 Ob and the lines 95a, 95b, 95c and 95d with some desired thickness $z_3$. These thicknesses $z_1$, $z_2$ and $z_3$ can be standard design rule determined thicknesses that can be utilized through many of the metallization layers 60, 65, 70, 75, 80, 85 and 90 depicted in FIGS. 2 and at least partially in FIG. 3. However, as noted in more detail below, other of the metallization layers, and in particular the metallization layer 80 to be described below, will deviate from the standard thicknesses and heights $z_1$, $z_2$ and $z_3$ to achieve a different RC behavior for closely spaced lines.

Referring again to FIG. 3, the metallization layer 75 consists of an etch stop layer 130 fabricated on the metallization layer 70. The purpose of the etch stop layer 130 will be described in more detail below. The metallization layer 75 includes plural conductor lines 135a, 135b, 135c, 135d and 135e (and others not visible) and plural conductive vias 140a and 140b interspersed in an ILD 137. While only a few conductor lines 135a, 135b, 135c, 135d and 135e are depicted, it should be understood that the metallization layer 75 and any of the other metallization layers 60, 75, 80, 85 and 90 can include many more such lines. In this illustrative arrangement, the conductor lines 135a, 135b, 135c, 135d and 135e and the conductor lines 95a, 95b, 95c, 95d and 95e are aligned in the same general direction, namely, extending into and out of the page. However, in other arrangements, conductor lines can alter orientation from one metallization layer to the next. For example, the conductor lines 95a, 95b, 95c, 95d and 95e in the metallization layer 70 could be coming into and out of the page, while the conductor lines 135a, 135b, 135c, 135d and 135e could be aligned parallel to the page and thus run orthogonal to the conductor lines 95a, 95b, 95c, 95d and 95e or vice versa. This alternating of alignment directions can exist for some or all of the metallization layers. The conductor lines 135a, 135b, 135c, 135d and 135e and the conductive vias 140a and 140b can be like the conductor lines 95a, 95b, 95c, 95d and 95e and the conductive vias 11 Oa, 11 Ob and 11 Oc in the metallization layer 70 described above. Accordingly, the lines 135a, 135b and 135d can each include a barrier layer 145 and a bulk conductor portion 150 and the lines 135c and 135e and the conductive vias 140a and 140b can similarly include contiguous barrier layers 145 and bulk conductor portions 150. The ILD 137 can be like the ILD 97 described above. The same dimensions $z_1$, $z_2$ and $z_3$ can be used for the lines 135a, 135b, 135c, 135d and 135e, vias 140a and 140b and the ILD 137. Note the unlabeled phantom lines demarcating the conductor line 13 Se and the via 140a and the line 135a and the via 140b. These dashed lines simply represent the invisible lower surfaces of the conductor line 135c and 135e, much like the lower surfaces 112a and 112b.

Still referring to FIG. 3, the vias 140a and 140b interconnect electrically with one or more of the conductor lines 95c and 95e of the metallization layer 70. Where those vias 140a and 140b connect to the underlying lines 95c and 95e, a barrier metal layer 160 is fabricated. The barrier layer 160 can be constructed of Ti, TiN, Ta, TaN, Ta, Ru, Co or the like and laminates of these or the like. The purpose of the barrier layer 160 is to protect the bulk conductor material 105 of the conductor lines 95c and 95e during fabrication and especially during those points in time when exposure to air or other processes might damage the bulk conductor material 105 of the lines 95c and 95e The conductor lines 95a, 95b, 95c, 95d and 95e of the metallization layer 70 and the conductor lines 135a, 135b, 135c, 135d and 135e of the metallization layer 75 can be fabricated with some preselected thickness $z_1$, the vias 110 and 140 can be fabricated with some preselected via height $z_2$ and the ILDs 97 and 137 can be fabricated with some preselected height $z_3$. The dimensions $z_1$, $z_2$ and $z_3$ can be used throughout various of the metallization layers 65, 70, 75, 80, 85 and 90 with a few exceptions to be described in detail below. While this utilization of standard thicknesses and heights zi, $z_2$ and $z_3$ can simplify processing from one layer to the next, it should be understood that these parameters could also be varied from layer to layer. Note that the conductor lines 95a, 95b, 95c, 95d and 95e of the metallization layer 70 and the conductor lines 135a, 135b, 135c, 135d and 135e of the metallization layer are constructed with a design aspect ratio $A_1$ given by:

$$A_1 = \frac{z_1}{x_1} \qquad (I)$$

The metallization layer 80 will now be described in conjunction with FIG. 3. The metallization layer 75 differs materially from the metallization layers 75 and 70 in a few important respects. Like the metallization layers 75 and 70, the metallization layer 80 includes plural conductor lines 175a, 175b, 175c, 175d and 175e and plural conductive vias, one of which is visible and labeled 180a. There can many such conductive vias in addition to the via 180a Note that a barrier layer 182 is formed between the conductive via 180a and the underlying conductor line 135a The barrier layer 182 can be constructed using the same types of materials described above for the barrier layer 160. However, the conductor lines 175a, 175b, 175c, 175d and 175e are constructed using a single damascene layer on a double damascene layer process. The conductor lines 175b, 175c, 175d and 175e are separated laterally by way of air gaps 185a, 185b and 185c, respectively, formed in a dielectric layer 187 that has portions interspersed between the conductor lines 175b, 175c, 175d and 175e. The conductor lines 175a, 175b, 175c, 175d and 175e each consist of a first line portion 190 positioned in a first ILD 195 and a second line portion 200 formed on the lower portion 190 and generally positioned in another ILD 205 and to some extent portions of the dielectric layer 187 in which the air gaps 185a, 185b and 185c are formed. The first line portions 190 are constructed using a double damascene process to simultaneously fabricate both the first line portions 190 and the conductive via 180a (and others not visible). Another etch stop layer 213 is fabricated between the ILDs 195 and 137. The second line portions 200 of the conductor lines 175a, 175b, 175c, 175d and 175e can each include a barrier layer 215 and a bulk conductor portion 220. The first line portions 190 of the lines 175a, 175b, 175d, 175d and 175e can each include a barrier layer 225 and a bulk conductor portion 230, however, the barrier layer 225 and bulk conductor portion 230 of the first line portion 190 of the conductor line 175a and the via 180a are fabricated as double damascene and thus are contiguous.

Note the unlabeled phantom line demarcating the first line portion 190 of the line 175a and the via 180a. This dashed line simply represents the invisible lower surface of the first line portion 190 of the line 175a, much like the lower surfaces 112a and 112d of the conductor lines 95a and 95d, respectively. An etch stop layer 210 is fabricated between the ILDs 195 and 205.

It is desirable to be able to make the spacing $x_3$ between adjacent conductor lines 175b and 175c or 175d and 175e in the metallization layer 80 as small as possible to provide improved packing density. Thus, the spacing $x_3$ between adjacent conductor lines 175b and 175c or 175d and 175e can be the same as the spacing $x_2$ used elsewhere or perhaps even smaller than $x_2$. However, making the spacing $x_3$ less than $x_2$ proportionally raises the lateral capacitance between lines in the same layer, such as lines 175d and 175e. Another consideration that can increase the capacitance between adjacent conductor lines, such as the lines 175d and 175e, is the shear length of such adjacent lines 175d and 175e. For example, where the metallization layer 80 is used for significant horizontal routing of signals, the conductor lines 175a, 175b, 175d, 175d and 175e will tend to have lengthy runs. Longer runs translate into increased capacitance. To counteract the capacitive increase of reducing the lateral spacing from $x_2$ to $x_3$ and/or increased line lengths, the dielectric layer 187 is preferably manufactured from low-K or ultra low-K materials, such as those described above, and is manufactured with the air gaps 185a, 185b and 185c. The usage of a low-K dielectric layer 187 with the air gaps 185a, 185b and 185c reduces the capacitance between adjacent lines, such as between lines 175b and 175c, and between lines 175c and 175d and so on.

The conductor lines 175a, 175b, 175c, 175d and 175e and vias 180a can be fabricated with higher aspect ratios than the aspect ration $A_1$ of the conductor lines 95a, 95b, 95c, 95d and 95e and vias 110a or lines 135a, 135b, 135c, 135d and 135e and vias 140a and 140b. The relatively taller, and thus, larger conductor lines 175a, 175b, 175c, 175d and 175e have proportionally less resistance than comparable width lines 95a, 95b, 95c, 95d and 95e and 135a, 135b, 135c, 135d and 135e. Il this illustrative arrangement, the conductor lines 175a, 175b, 175c, 175d and 175e can be fabricated with some thickness $z_4$ which is a multiple of the line thickness $z_1$ used elsewhere, such as in the metallization layers 70 and 75. For example, $z_4$ can be given by:

$$z_4 = k_1 z_1 \quad (2)$$

where $k_1$ is some multiplier. Note that the thickness $z_4$ is a combination of the thickness $z_5$ of a second line portion 200 and the thickness, of a first line portion 190. The thickness $z_5$ of the second line portion 200 is a multiple of the line thickness $z_1$ used elsewhere, such as the metallization layers 70 and 75. For example, $z_5$ can be given by:

$$z_5 = k_2 z_1 \quad (3)$$

where $k_2$ is some multiplier. The thickness $z_5$ of a first line portion 190 is a multiple of the line thickness $z_1$ used elsewhere, such as the metallization layers 70 and 75. For example, 26 is given by:

$$z_6 = k_3 z_1 \quad (4)$$

where $k_3$ is some multiplier. The vias 180a can be fabricated with some height $z_7$, which is a multiple of the via height $z_2$ used elsewhere, such as the metallization layers 70 and 75. For example, $z_7$ is given by:

$$z_7 = k_4 z_2$$

where $k_4$ is some multiplier. The ILD 195 is fabricated with some preselected height zs, where zs is given by:

$$z_8 = z_6 + z_7 \quad (5)$$

The ILD 205 is fabricated with the preselected height $z_5$. Of course, the thickness zs and the etch depth to create the first line portions 190 will determine the values of $z_7$ and $z_6$. Some exemplary values are listed in the following table:

TABLE 1

| Parameter | Multiplier | Multiplier Value | Relationship |
| --- | --- | --- | --- |
| $z_4$ | $k_1$ | 1.5 | $z_4 = 1.5 z_1$ |
| $z_5$ | $k_2$ | 1 | $z_5 = z_1$ |
| $z_6$ | $k_3$ | 0.5 | $z_4 = 1.5 z_1$ |
| $z_7$ | $k_4$ | 1.5 | $z_7 = 1.5 z_2$ |

By stacking the first line portion 190 and the second line portion 200, larger conductor lines 175a, 175b, 175c, 175d and 175e with lower resistance can be constructed with an aspect ratio $A_2$ given by:

$$A_2 = \frac{z_4}{x_1} \quad (6)$$

that is larger than the standard aspect ratio $A_2$ without having to attempt extremely difficult high aspect ratio dielectric directional etch techniques. But note that when the aspect ratio $A_2$ is increased, the capacitance C between adjacent lines, such as conductor line 175a and 175b and 175b and so on, is increased due to increase overlap area between the adjacent lines 175a and 175b and so on. However, as the increased capacitance C is offset by the decreased resistance R, so the overall RC product, that is, resistance multiplied by capacitance, should stay relatively the same. In this illustrative arrangement, the process is tailored to make the thicknesses of the conductor lines 175a, 175b, 175c, 175d and 175e 1.5 times thicker than the conductor lines 95a, 95b, 95c, 95d, 95e, 135a, 135b, 135c, 135d and 135e and the vias 180a 1.5 times thicker than the vias 110a, 140a, etc. However, it should be understood that the multipliers $k_1$, $k_2$, $k_3$ and $k_4$ can take on a variety of values. Note that the value of $z_7$ can be selected to yield an acceptable vertical capacitance between the conductor lines 175a, 175b, etc., and underlying conductors, such as conductor lines 135a, 135b, etc. In addition, the value of $z_7$ sets the value of the via height $z_7$ combined with the first line portion height $z_6$ and $z_7$ and $z_6$ are approximately inversely proportional according to:

$$z_6 \propto \frac{1}{z_7} \quad (7)$$

Figure 5:
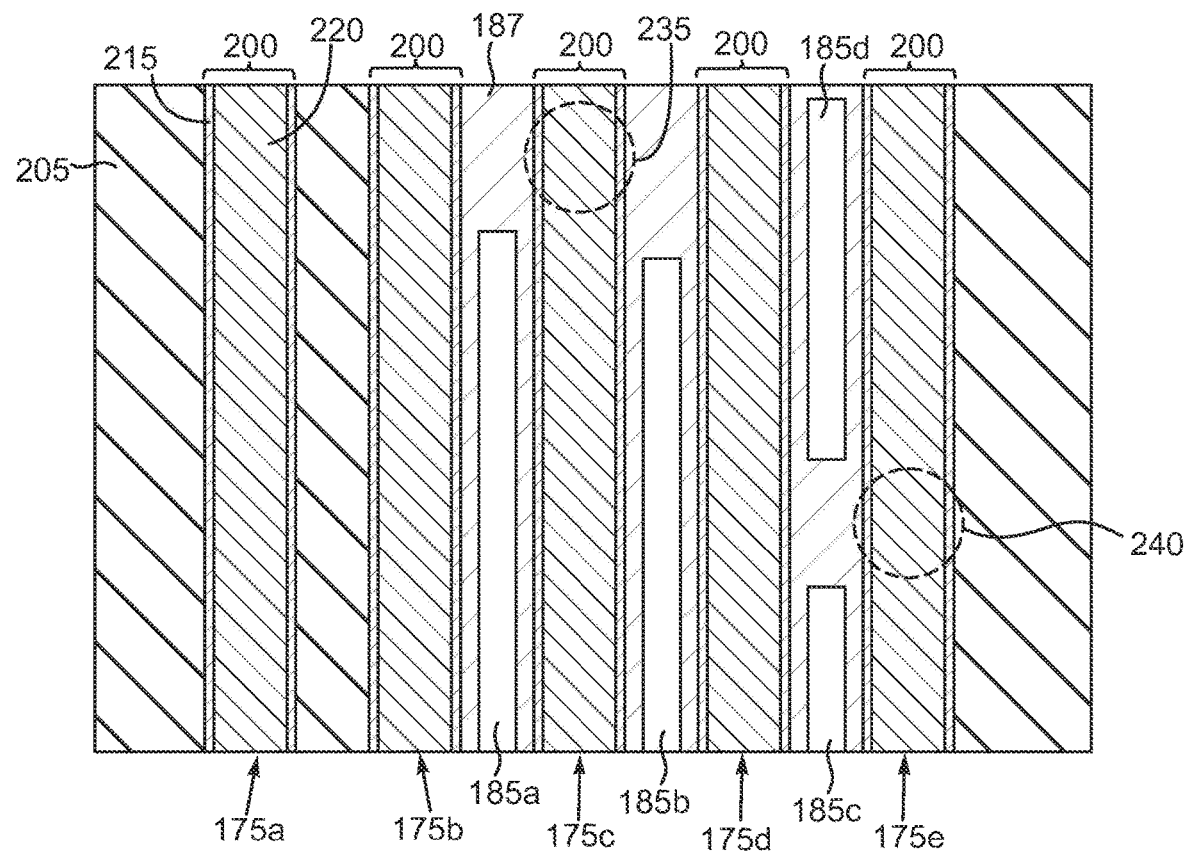
FIG. 5 is a sectional view of FIG. 3 taken at section 5-5.

It should be understood that the air gaps 185a, 185b and 185c do not necessarily extend across the entire expanse of the semiconductor chip 15 (i.e., in and out of the page and along the y axis shown in FIG. 1). Indeed, the air gaps 185a, 185b and 185c can be various lengths and non-contiguous, that is, consist of segments, so as to avoid being positioned near via locations. In this regard, attention is now turned also to FIG. 5, which is a sectional view of FIG. 3 taken at section 5-5. Note that section 5-5 passes through the ILD 205, the dielectric layer 187 and the air gaps 185a, 185b, 185c and another air gap 185d that was not visible in FIG. 3. The second line portions 200 of the conductor lines 175a, 175b, 175c, 175d and 175 are shown in section 5-5 and reveal the barrier layers 215 and bulk conductors 220. As evident from FIG. 5, the air gaps 185a and 185b terminate short of the via location represented by the dashed circle 235 and the air gaps 185c and 185d both terminate short of the via location represented by the dashed circle 235. Treating the via locations 235 and 240 as keep-out zones for the air gaps 185a, 185b, etc., avoids the potential for via material spillover in the event of process misalignment during subsequent via masking and etch definition.

Figure 6:
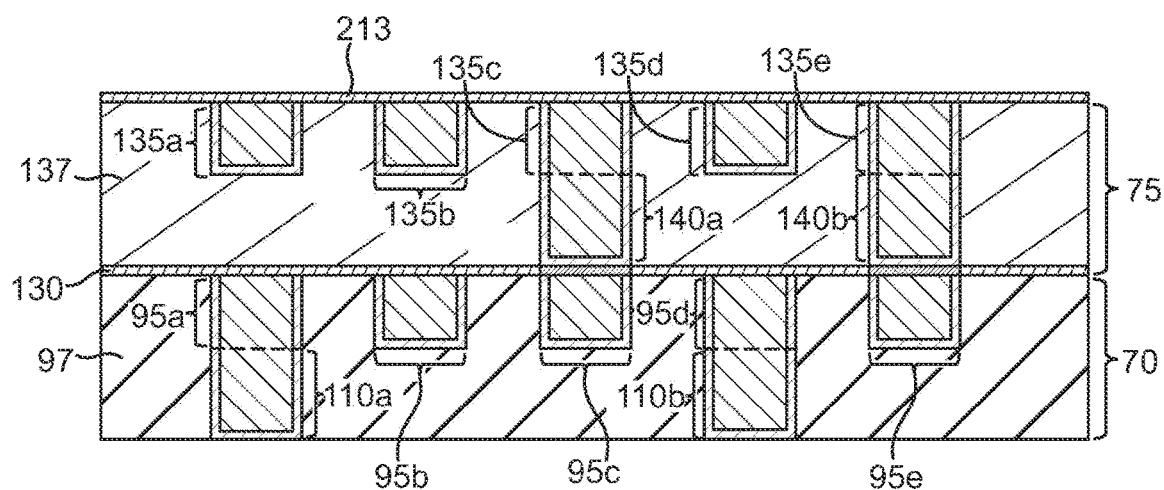
FIG. 6 is a sectional view depicting initial processing of a couple of exemplary metallization layers.

An exemplary method for fabricating the metallization layer 80 will be described now in conjunction with FIGS. 6 through 26. Some of the process steps to be described below will be common to the processes to fabricate the other metallization layers, such as the metallization layers 20 and 75, and in those instances the commonality will be pointed out. The processes can be performed on a wafer level or die level basis. Attention is turned now to FIG. 6, which is a sectional view like FIG. 3 but depicting only the fabricated metallization layers 70 and 75 and the initial processing to fabricate the metallization layer 80 depicted in FIGS. 2 and 3. It should be understood that the metallization layer 70 has already undergone a multitude of processing steps in order to fabricate the ILD 97, the conductor lines 95a, 95b, 95c, 95d and 95e and the vias 110a and 110b and the etch stop layer 130, and the same is true with regard to the metallization layer 75 and the construction of the ILD 137, the conductor traces or lines 135a, 135b, 135c, 135d and 135e and the vias 140a and 140b. Double damascene processing is used to fabricate lines and vias simultaneously, such as the conductor lines 95a and 95d and the underlying vias 110a and 110b, as well as the conductor lines 135c and 135e and underlying vias 140a and 140b. Attention is now turned again to the initial fabrication of the metallization layer 80 depicted in FIGS. 2 and 3. As shown in FIG. 6, initially the etch stop layer 213 is fabricated on the metallization layer 75. The etch stop layer 213 is advantageously fabricated from materials that are relatively resistant to etch processes that are used to etch trenches and vias in the later deposited ILD 195 shown in FIG. 3. Exemplary materials for the etch stop layer 213 include ALx, SiCN, silicon oxynitride or the like. Well-known CVD techniques can be used to fabricate the etch stop layer 213.

Figure 7:
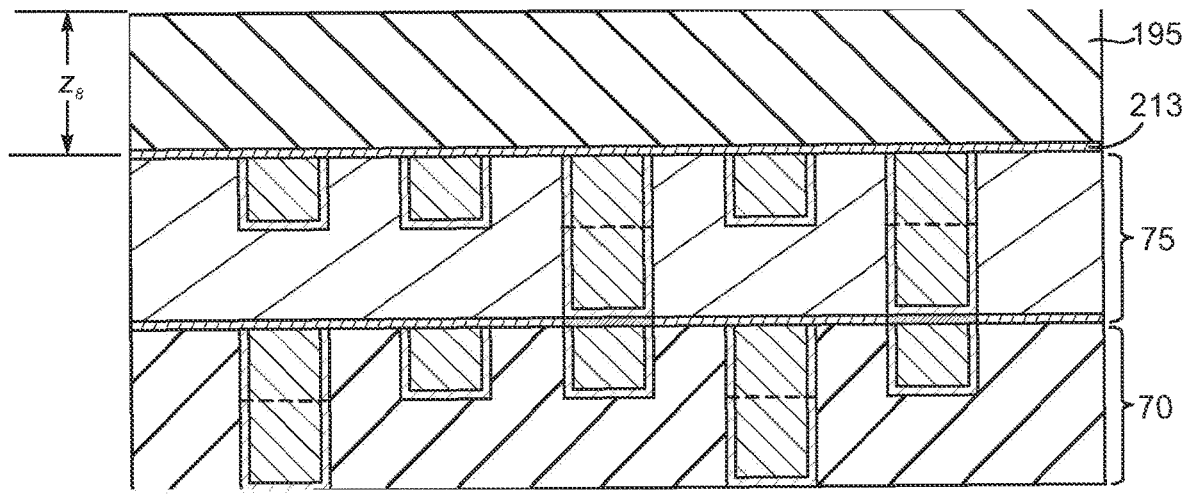
FIG. 7 is a sectional view like FIG. 6 but depicting additional processing to create an additional metallization layer.

Next as shown in FIG. 7, the ILD 195 is fabricated on the etch stop layer 213 and the underlying metallization layers 70 and 75. As noted above, the ILD 195 can be composed of the types of materials described for the ILD 97 and deposited to the thickness $z_8$. It is anticipated that the thickness of the etch stop layer 213 is relatively thin compared to the thickness of the overlying ILD 195 and thus the depth $z_8$ incorporates the thickness of the etch stop layer 213. As noted above, well-known CVD processes can be used to deposit the ILD 195.

Figure 8:
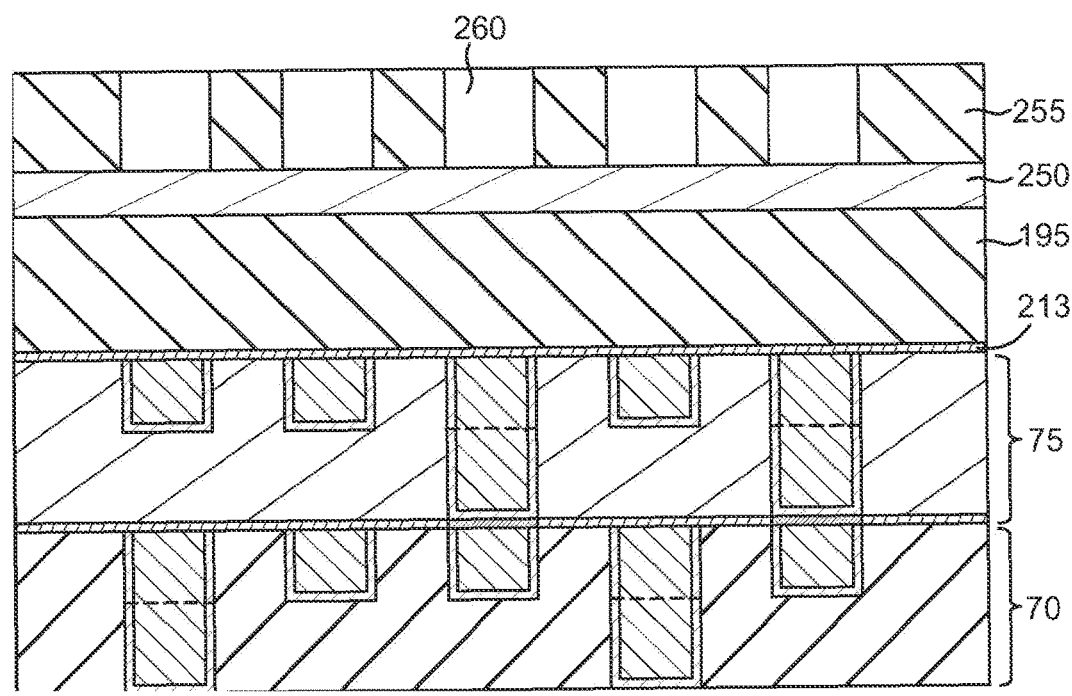
FIG. 8 is a sectional view like FIG. 7, but depicting additional processing to construct the additional metallization layer.

Next and as shown in FIG. 8, a hard mask layer 250 is applied to the ILD 195 and a resist mask 255 is applied to the hard mask layer 250 and patterned with appropriate openings 260. The hard mask material layer 250 is advantageously composed of silicon nitride or other suitable hard mask materials and will serve as a hard etch mask for subsequent etch definition of trenches in the ILD 195 where the first line portions 190 depicted in FIG. 3 will be fabricated. Accordingly, the openings 260 in the resist mask 255 are suitably sized and positioned to correspond to the future locations of those first line portions 190. Well-known CVD processes can be used to deposit the hard mask material layer 255 and well-known spin coating or other application processes followed by suitable baking and photolithography can be used to apply and pattern the mask 255. The metallization layers 70, 75, the etch stop layer 213 and the ILD 195 remain unaffected by these processing steps.

Figure 9:
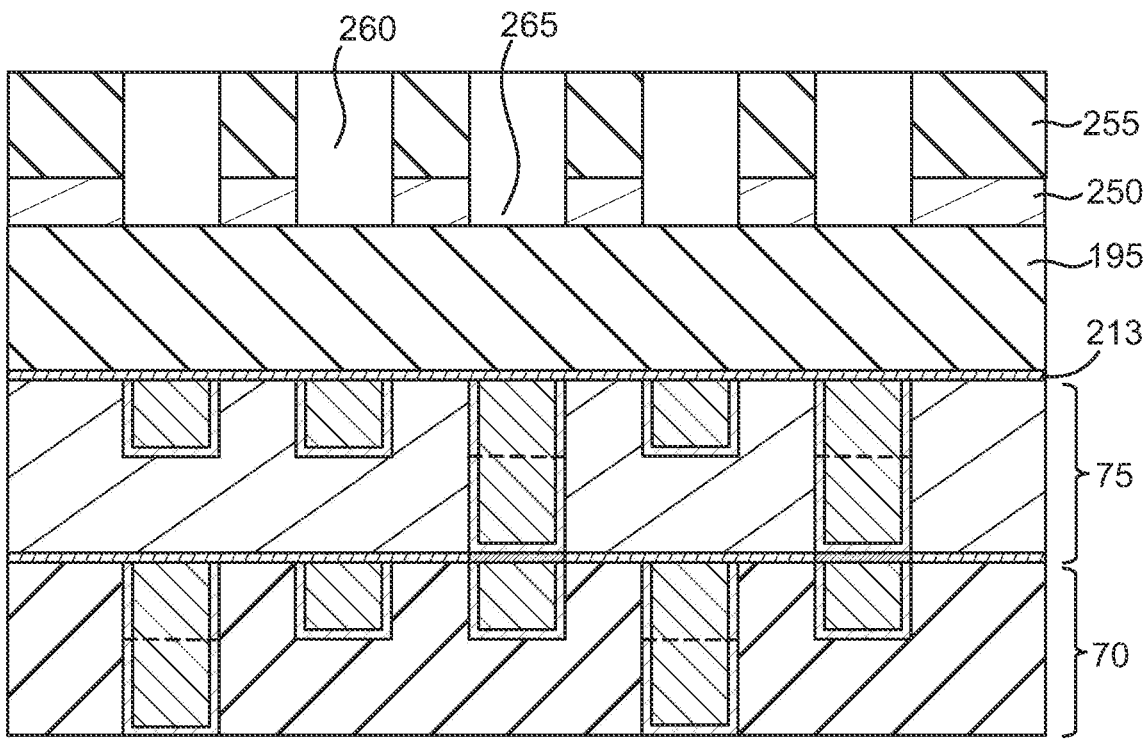
FIG. 9 is a sectional view like FIG. 8, but depicting additional processing to construct the additional metallization layer.
Figure 10:
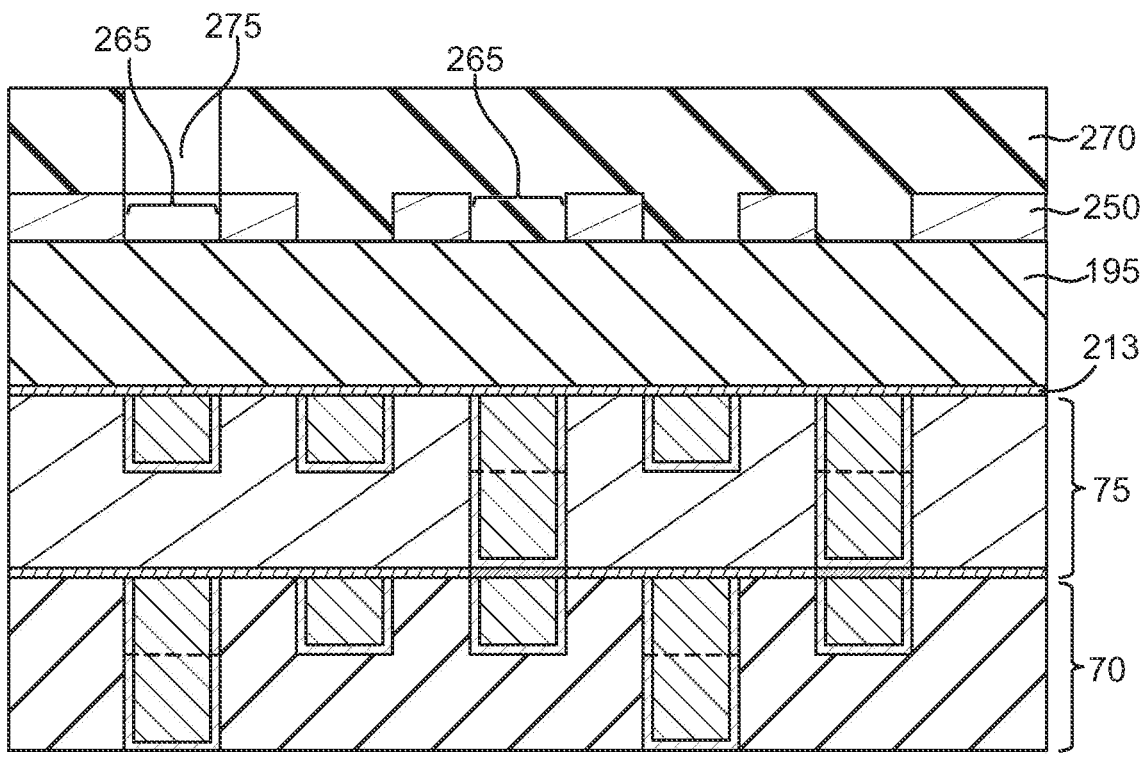
FIG. 10 is a sectional view like FIG. 9, but depicting additional processing to construct the additional metallization layer.

Next and as shown in FIG. 9, the hard mask material layer 250 undergoes an etch process to establish plural openings 265 therein which are aligned with the openings 260 and the resist layer 255 and as noted above which correspond to the future locations of the first line portions 190 depicted in FIG. 3. Well-known directional etching techniques and chemistries can be used to etch the hard mask layer 250 such as, for example, reactive ion etching using, for example, $CF_4+O_2$, $NF_3$ or other suitable chemistries. End point detection can be by timing or emission spectroscopy. The metallization layers 70, 75, the etch stop layer 213 and the ILD 195 remain unaffected by these processing steps. Following the etch definition of the openings 265 in the hard mask layer 250, the resist mask 255 is stripped using well-known ashing, solvent stripping or combinations of the two and a second resist mask 270 is applied over the hard mask layer 250 and patterned as shown in FIG. 10. The mask 270 can be composed of the same types of materials and processed in the same way as the mask 255 depicted in FIG. 9. Here, however, the mask 270 is patterned lithographically with plural openings, one of which is shown and labeled 275, that are appropriately sized and located at positions where the vias, such as the via 180a shown in FIG. 3, will be subsequently fabricated. Those openings 265 in the hard mask layer 250 destined for subsequent trench etch only are covered b the mask 270. The metallization layers 70, 75, the etch stop layer 213 and the ILD 195 remain unaffected by these processing steps.

Figure 11:
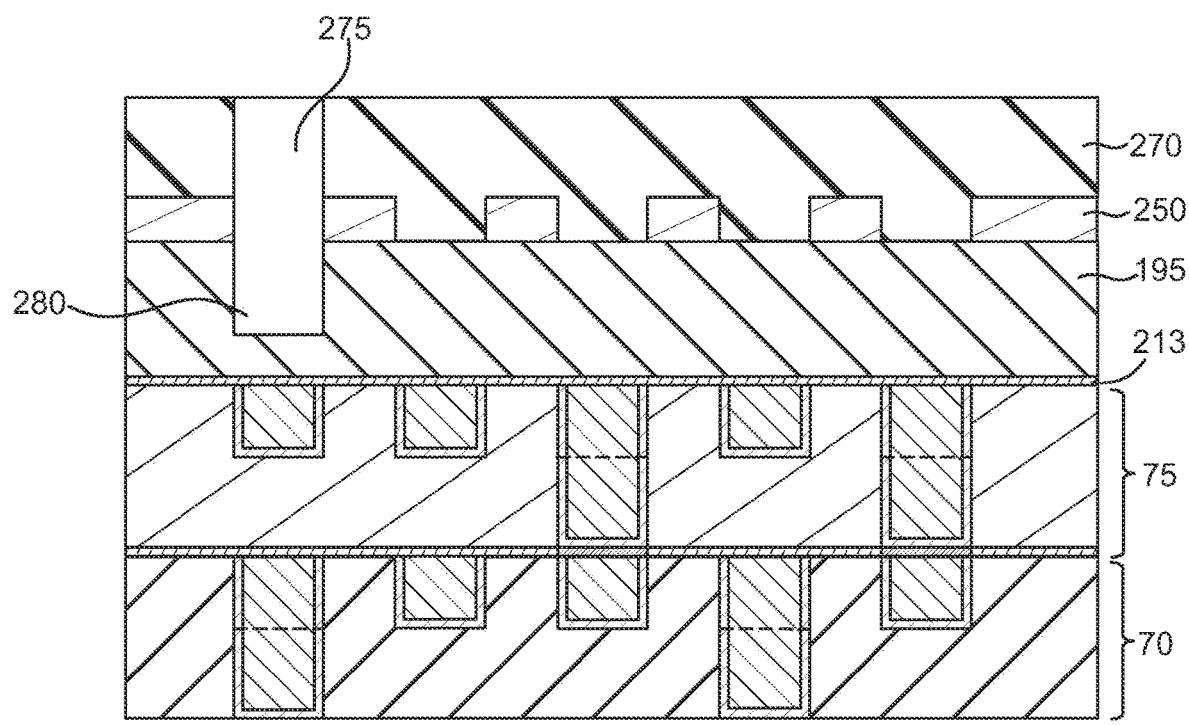
FIG. 11 is a sectional view like FIG. 10, but depicting additional processing to construct the additional metallization layer.
Figure 12:
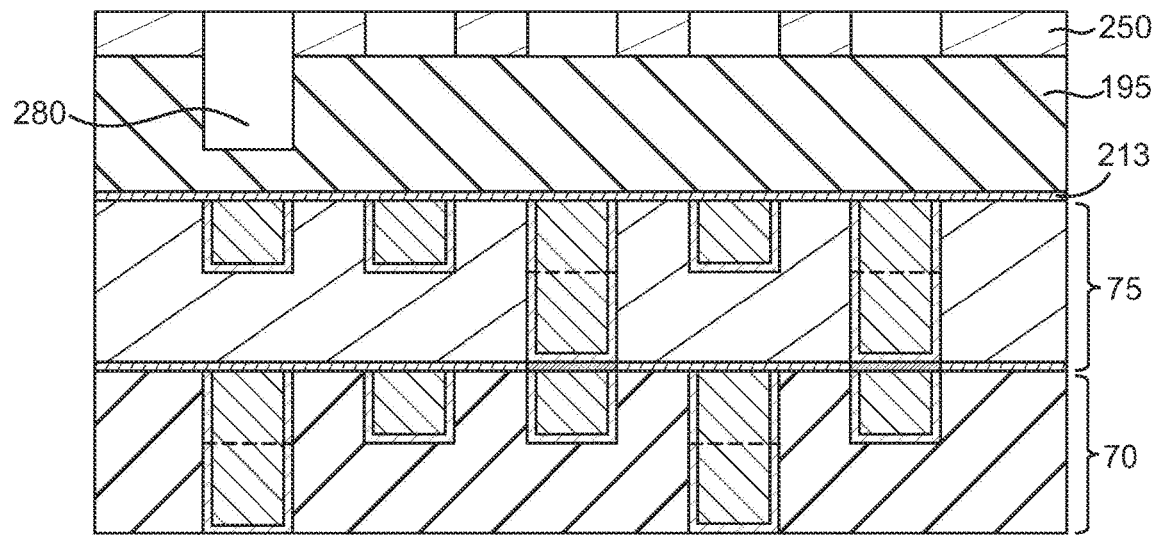
FIG. 12 is a sectional view like FIG. 11, but depicting additional processing to construct the additional metallization layer.

Next and as depicted in FIG. 11, with the resist mask 270 in place and appropriately patterned with the opening 275, a directional etch is conducted on the ILD 195 to generate a via hole 280 in alignment with the mask opening 275. This via hole 280 will typically have the same footprint albeit not necessarily the same subsequent final depth of the later formed via 180a shown in FIG. 3. Well-known directional etching techniques and chemistries can be used to etch the ILD 195 such as, for example, reactive ion etching using, for example, $CF_4$, $CF_4+O_2$, $SF_6$, $NF_3$ or other suitable chemistries. End point detection can be by timing or emission spectroscopy. Subsequent to the etch of the opening 280 in the ILD 195, the resist mask 270 is stripped as shown in FIG. 12 and using the photoresist stripping techniques described elsewhere herein. The metallization layers 70, 75, the etch stop layer 213 and the ILD 195 remain unaffected by these processing steps. However, the hard mask 250 is now exposed and ready to serve as an etch mask.

Figure 13:
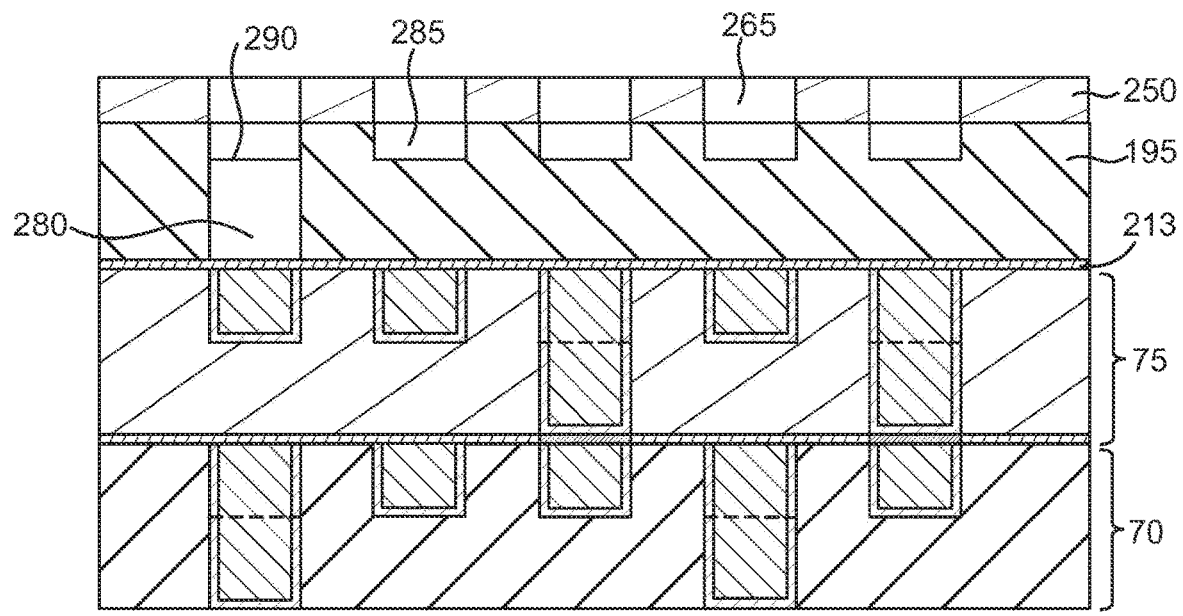
FIG. 13 is a sectional view like FIG. 12, but depicting additional processing to construct the additional metallization layer.

Next and as shown in FIG. 13, a second etch of the ILD 195 is performed, this time using the hard mask 250 as the etch mask. Here, the etch produces trenches 285 in the ILD 195 at the locations of the hand masking openings 265 and thus also of the first line portions 190 (see FIG. 3) to be formed later. This etch also deepens the via hold 280 down to the etch stop 213. The same etch techniques just described in conjunction with FIG. 11 can be used here as well. Of course the etch stop layer 213 is advantageously fabricated from materials that are relatively resistant to the etch chemistries used to perform the ILD etch. Note that this etch produces a shoulder 290. This shoulder 290, when viewed from above, would appear as an edge that has the perimeter that corresponds to the footprint of the via hole 280 and where the via hole 280 is circular the shoulder 290 would be circular when viewed from above. The metallization layers 70 and 75 and the ILD 195 remain unaffected by these processing steps.

Figure 14:
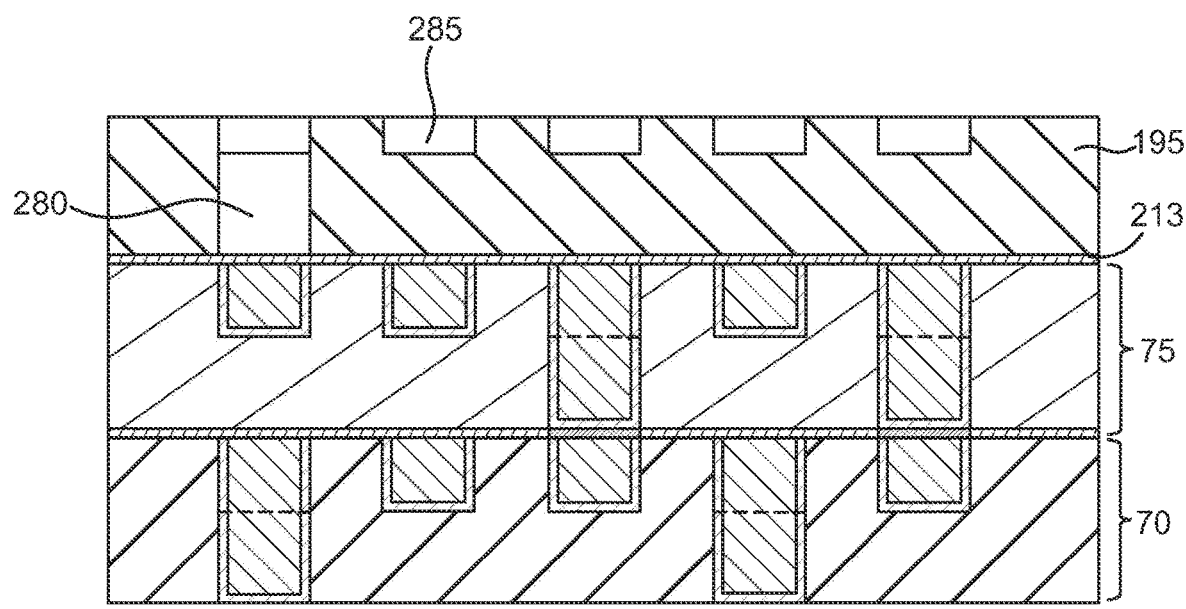
FIG. 14 is a sectional view like FIG. 13, but depicting additional processing to construct the additional metallization layer.

Following the etch definition of the trenches 285 and the deepening of the via hole 280, the hard mask layer 250 is etched away as shown in FIG. 14 to leave the ILD 195 exposed as well as the trenches 285 and the via hole exposed. A variety of well-known etching techniques may be used to strip the hard mask layer 250 such as a hot phosphoric acid dip or the dry etching techniques described elsewhere herein for etching the openings 265 in the hard mask 250. The metallization layers 70 and 75 remain unaffected by these processing steps.

Figure 15:
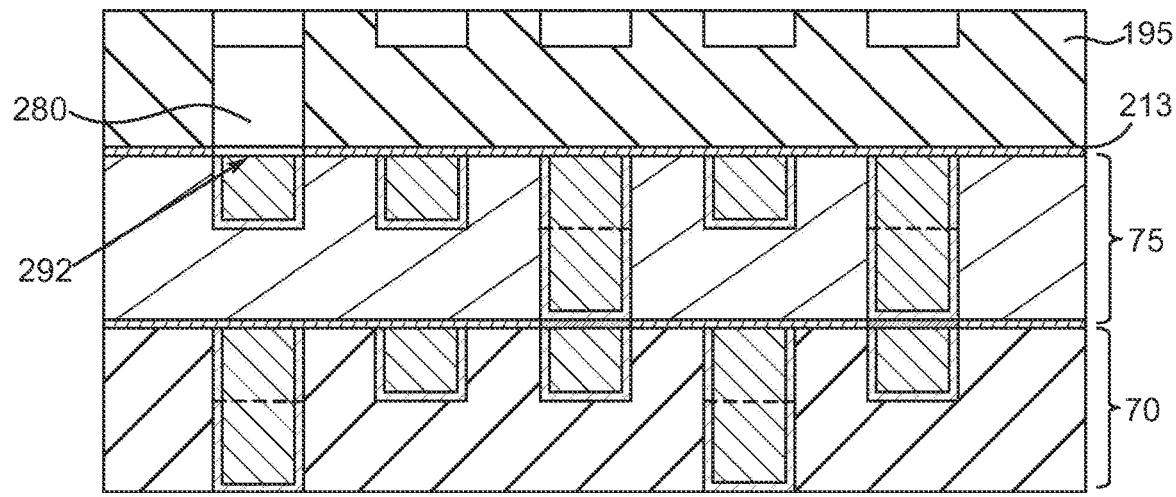
FIG. 15 is a sectional view like FIG. 14, but depicting additional processing to construct the additional metallization layer.

Next and as shown in FIG. 15, another etch process is performed. Prior to fabricating the conductive via 180a in ohmic contact with the underlying conductor line 135a, it is necessary to create an opening in the etch stop layer 213 at the location of the via hole 280. As shown in FIG. 15, a quick etch with chemistry suitable to penetrate the etch stop layer 215 is performed using well-known etch chemistries with plasma selective to the ILD 195. It is anticipated that the etch to establish the opening 292 is brief enough so as not to materially impact the structural integrity of the ILD 195. The metallization layers 70 and 75 remain unaffected by these processing steps.

Figure 16:
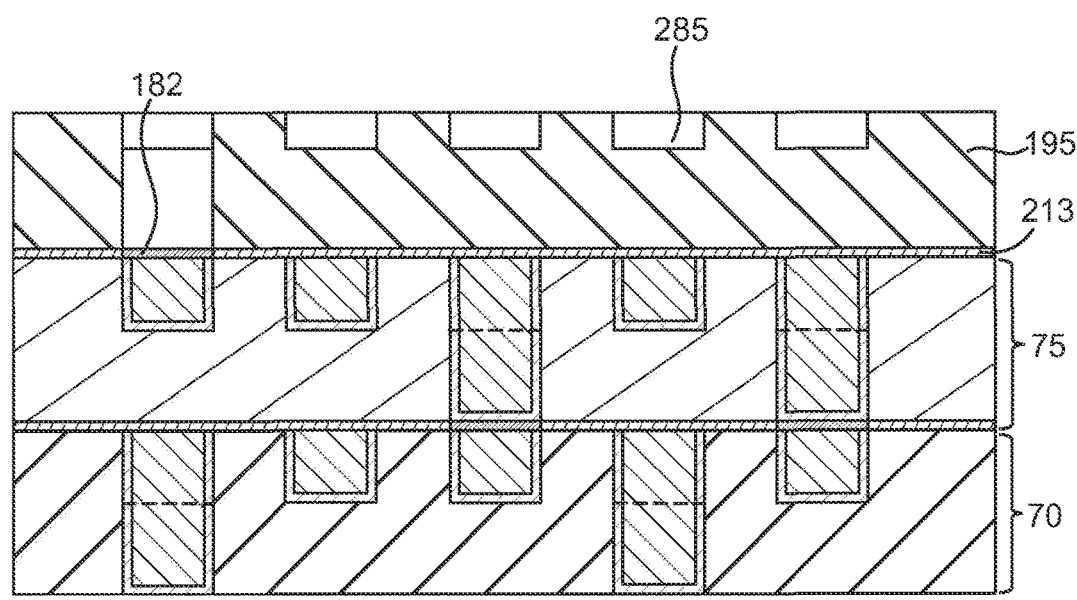
FIG. 16 is a sectional view like FIG. 15, but depicting additional processing to construct the additional metallization layer.

Next and as shown in FIG. 16, a barrier metal deposition process is performed to establish the barrier layer 182 in ohmic contact with the underlying conductor line 135a. Well-known CVD, PVD or plating processes can be used to fabricate the barrier layer 182. The metallization layers 70 and 75 remain unaffected by these processing steps.

Figure 17:
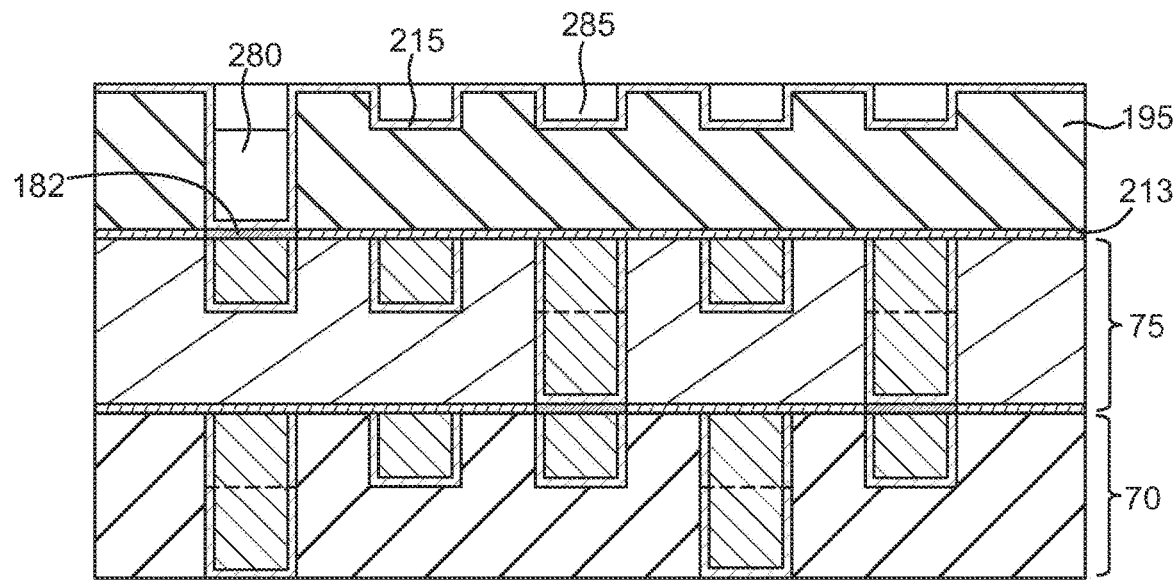
FIG. 17 is a sectional view like FIG. 16, but depicting additional processing to construct the additional metallization layer.

Next and as shown in FIG. 17, the barrier layer 225 is deposited on the ILD 195 filling the via hole 280 and the trenches 285. Well-known CVD or PVD processes can be used to establish the barrier layer 225. A portion of the barrier layer 225 contacts the barrier layer 182. The metallization layers 70 and 75 remain unaffected by these processing steps.

Figure 18:
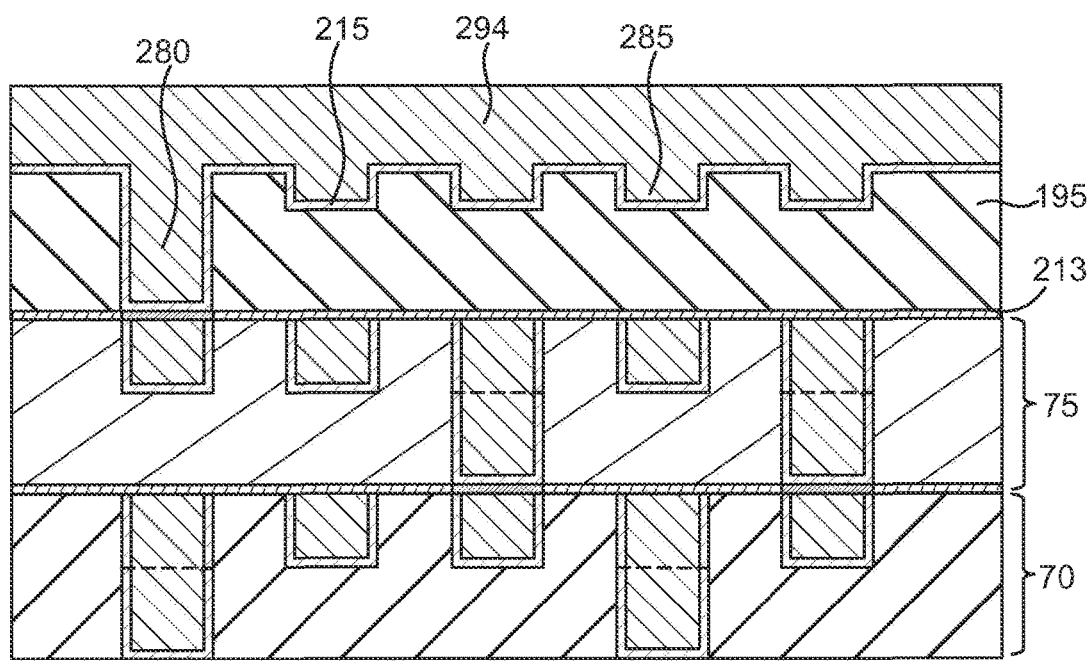
FIG. 18 is a sectional view like FIG. 17, but depicting additional processing to construct the additional metallization layer.
Figure 19:
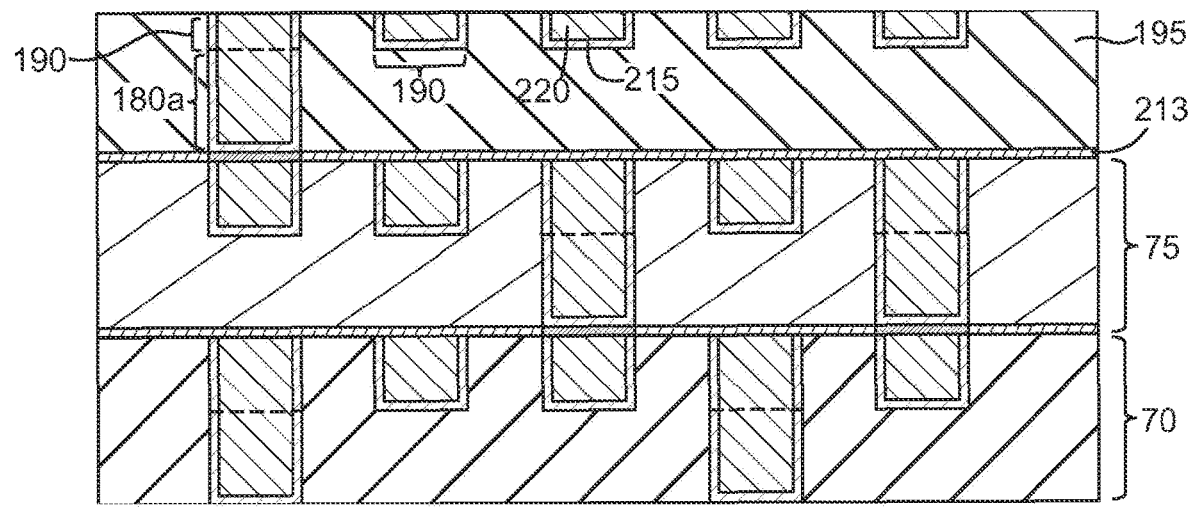
FIG. 19 is a sectional view like FIG. 18, but depicting additional processing to construct the additional metallization layer.

Next and as shown in FIG. 18, a plating process is advantageously performed to establish a blanket conductor layer 294. The conductor layer 294 will be subsequently polished to create the bulk conductor portions 230 depicted in FIG. 3 and described above. The blanket conductor layer 294 fills in over the barrier layer 225 and of course fills the trenches 285 and the via hole 280. At this stage, the blanket conductor layer 294 is polished back as shown in FIG. 19, such as by chemical mechanical polishing, to remove portions of the blanket conductor layer 294 and the barrier layers 225 projecting above the ILD 195 and thereby yield the first line portions 190 and because of the dual damascening nature simultaneously establishes the conductive via 180a. The metallization layers 70 and 75 and the etch stop 213 remain unaffected by these processing steps. Now it should be understood that the techniques just described to yield the first line portions 190 and the via 180a can be used, albeit with different line thicknesses and via heights, to fabricate the conductor lines 95a, 95b, 95c, 95d, 95e, 135a, 135b, 13 Sc, 13 Sd and 13 Se and the vias 11 Oa, 11 Ob, 140a and 140b, the ILDs 97 and 137, the etch stop 130 and the barrier 170 of the metallization layers 70 and 75 shown in FIG. 3.

Figure 20:
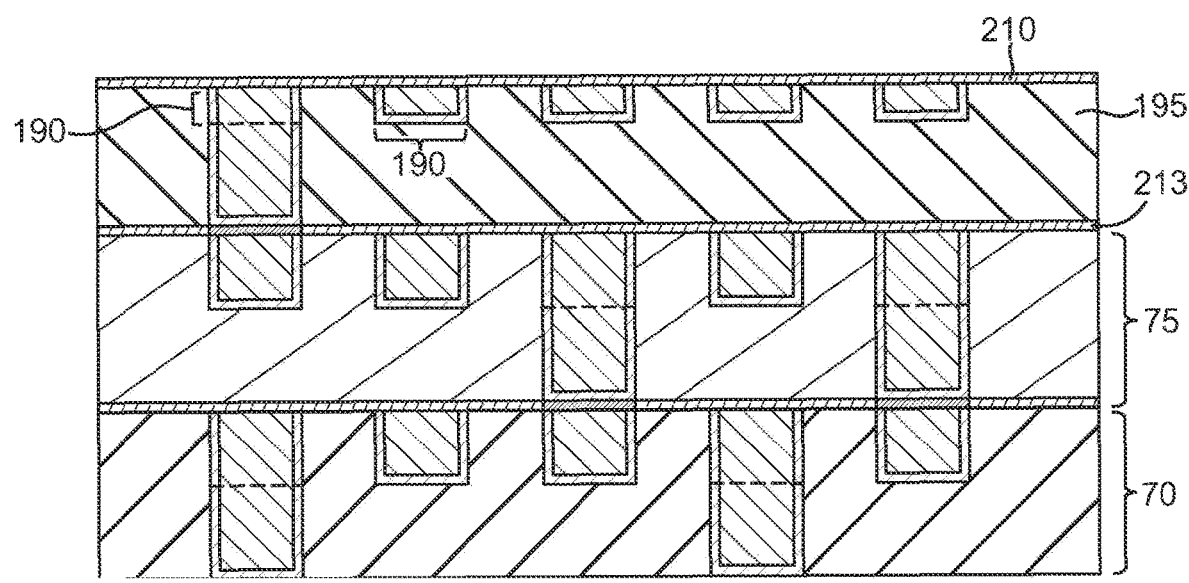
FIG. 20 is a sectional view like FIG. 19, but depicting additional processing to construct the additional metallization layer.

Next and as shown in FIG. 20, the etch stop layer 210 is fabricated on the ILD 195 and over the first line portions 190 using the same types of materials and techniques disclosed elsewhere for the etch stop layer 213. The metallization layers 70 and 75 and the etch stop 213 remain unaffected by these processing steps.

Figure 21:
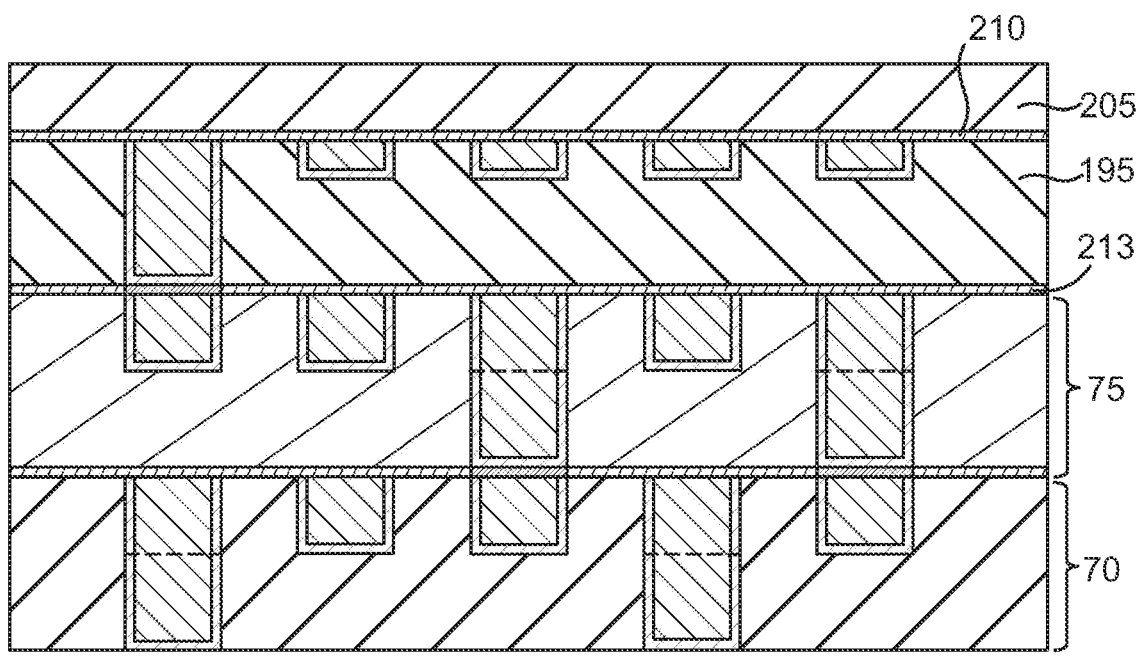
FIG. 21 is a sectional view like FIG. 20, but depicting additional processing to construct the additional metallization layer.

Next and as shown in FIG. 21, the ILD 205 is fabricated on the etch stop layer 210. The same types of materials and techniques used to establish the ILD 195 can be used to fabricate the ILD 205. The metallization layers 70 and 75, the ILD 195 and the etch stop 213 remain unaffected by these processing steps. The metallization layers 70 and 75 and the etch stop 213 remain unaffected by these processing steps.

Figure 22:
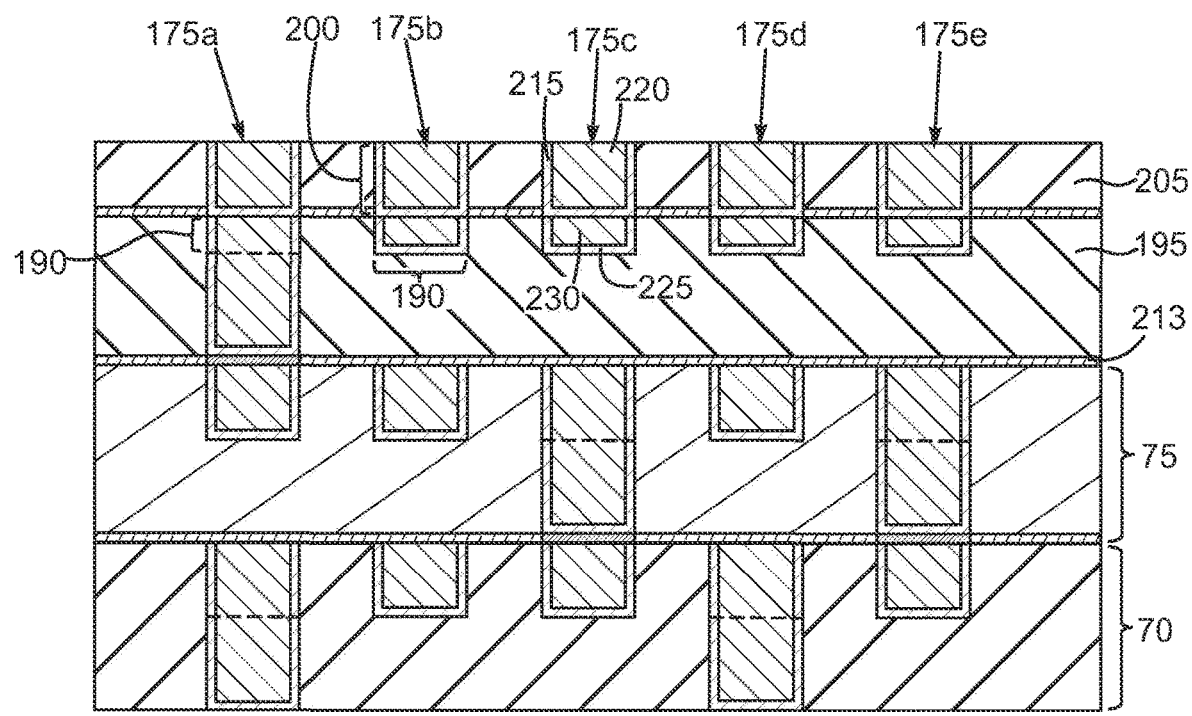
FIG. 22 is a sectional view like FIG. 21, but depicting additional processing to construct the additional metallization layer.

As is evident from FIG. 22, the processing steps used to establish the first line portions 190 are repeated to establish the second line portions 200 in the ILD 205 that, along with the lower portions 190, make up the conductor lines 175a, 175b, 175c, 175d and 175e. These include the aforementioned hard mask and multiple photoresist masking steps and etching, followed by material deposition and polishing in order to establish the completed conductor lines 175a, 175b, 175c, 175d and 175e that each consist of a barrier layer 215 and a bulk conductor layer 220. The metallization layers 70 and 75 and the etch stop 213 remain unaffected by these processing steps.

Figure 23:
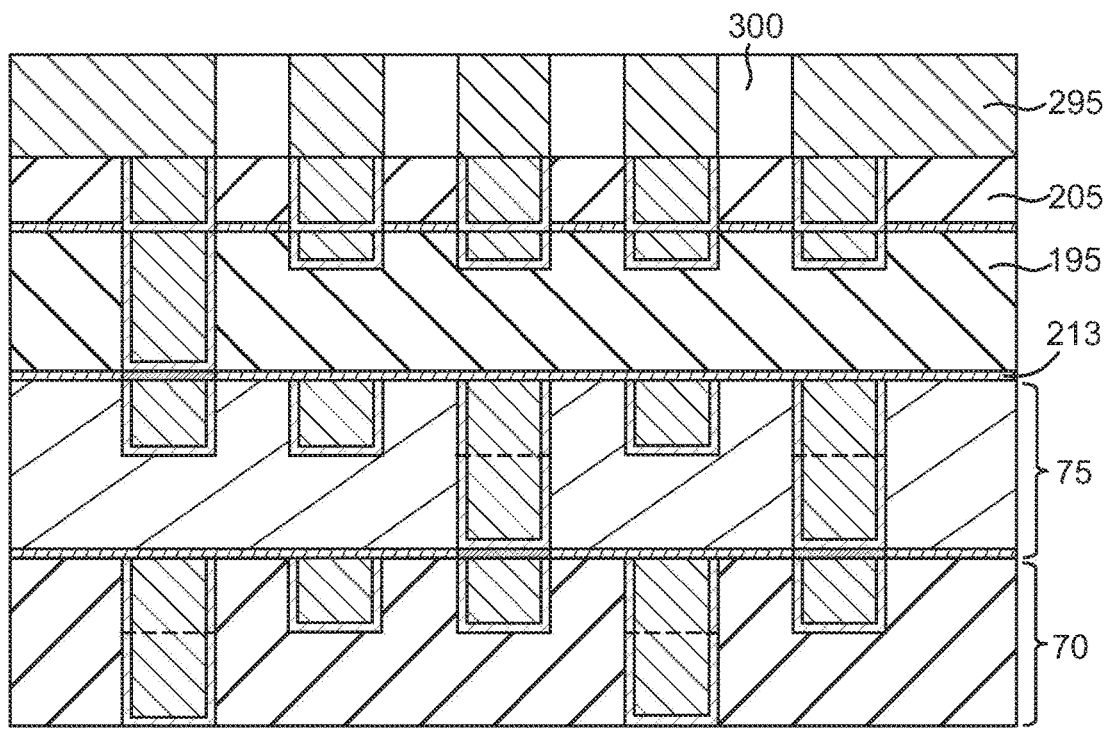
FIG. 23 is a sectional view like FIG. 22, but depicting additional processing to construct the additional metallization layer.

Next and as shown in FIG. 23, a resist mask 295 is applied to the ILD 205 and appropriately patterned with openings 300 that correspond to the desired footprints and locations for openings to be etched into the ILD 205 where the air gaps 185a, 185b, 185c and 185d disclosed above will be fabricated. The same types of techniques discussed above for the other photoresist masks may be used to apply and pattern the resist mask 295 and pattern the openings 300 therein. The metallization layers 70 and 75, the ILD 195 and the etch stop 213 remain unaffected by these processing steps.

Figure 24:
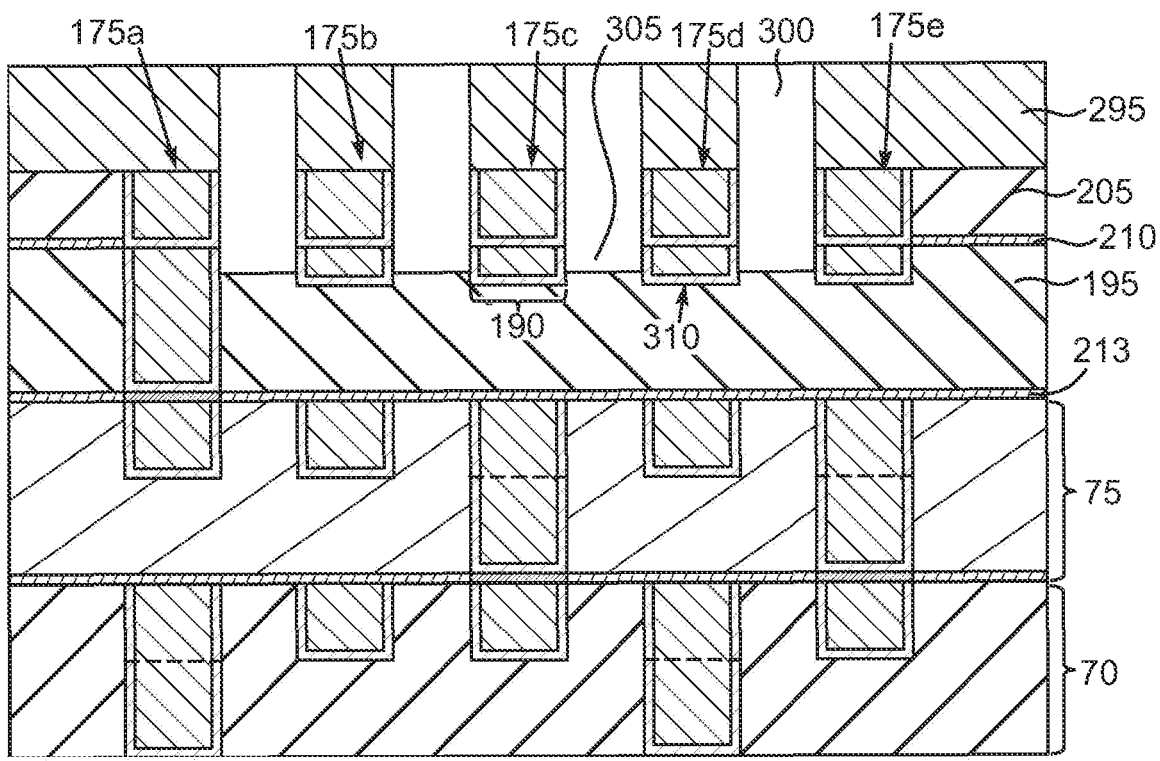
FIG. 24 is a sectional view like FIG. 23, but depicting additional processing to construct the additional metallization layer.

Next and as shown in FIG. 24, the ILD 205 is directionally etched to establish plural openings 305 therein in alignment with the masked openings 300. This etch to establish the openings 300 can be performed in a variety of ways. In the exemplary arrangement disclosed in FIG. 24, the etch is performed such that the openings 305 penetrate not only the ILD 205 but also the etch stop layer 210 and a portion of the ILD 195 but stop short of the bottoms 310 of the first line portions 190. The depth of the openings 305 will determine the vertical extent of the subsequently formed air gaps 185a, 185b, 185c and 185d Taller air gaps 185a, 185b, 185c and 185d present lower capacitance but it may be desirable to perform the etch of the openings 305 in such a way that the depth does not reach the bottoms 310 or even does not penetrate the etch stop layer 210. The etch chemistries and techniques disclosed elsewhere herein for etching the ILD 195 can be used here. The metallization layers 70 and 75 and the etch stop 213 remain unaffected by these processing steps.

Figure 25:
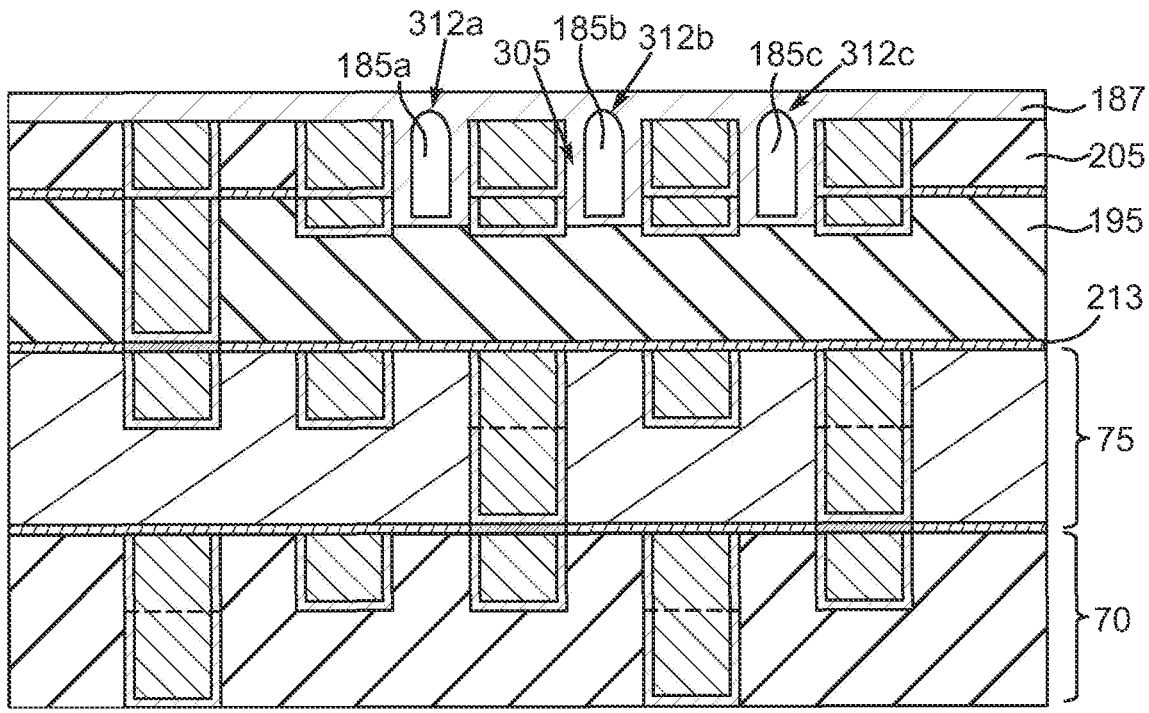
FIG. 25 is a sectional view like FIG. 24, but depicting additional processing to construct the additional metallization layer.

Next and as shown in FIG. 25, the dielectric layer 187 is fabricated over the ILD 205 using well-known CVD processes and the materials disclosed above. Prior to the CVD process for the dielectric layer 187, the resist mask 295 depicted in FIG. 24 is stripped using the techniques disclosed elsewhere herein. As the CVD process to establish the layer 187 progresses the sidewalls and bottom 310 of the openings 305 in the ILD 205 and the ILD 195 are progressively coated with the dielectric material 187 until bridging occurs at locations 312a, 312b and 312c, which establishes the aforementioned air gaps 185a, 185b and 185c The metallization layers 70 and 75 and the etch stop 213 remain unaffected by these processing steps.

Figure 26:
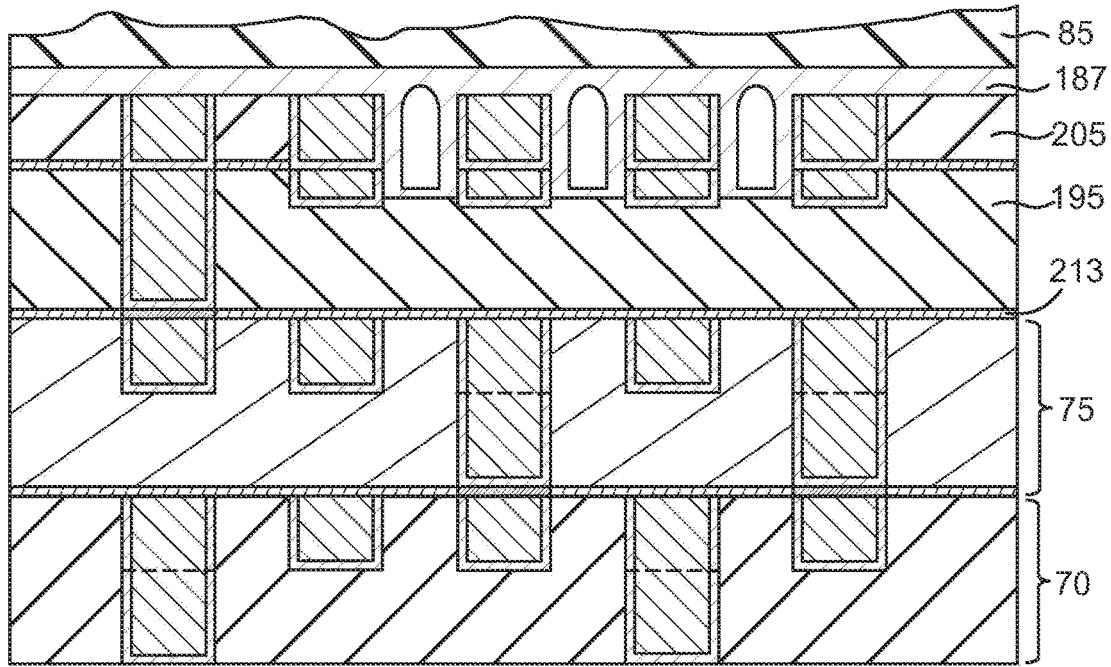
FIG. 26 is a sectional view like FIG. 25, but depicting additional processing to construct the additional metallization layer.
Figure 27:
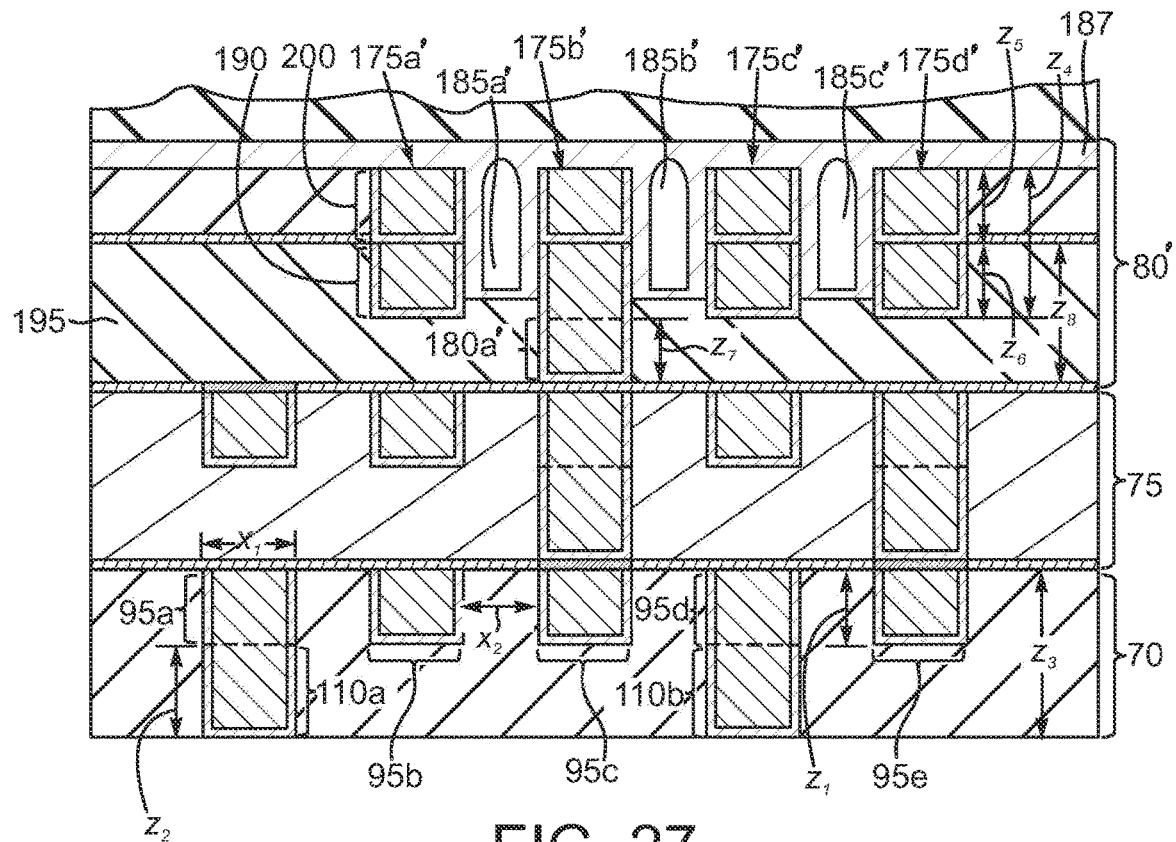
FIG. 27 is a sectional view like FIG. 3, but depicting an alternate exemplary semiconductor chip metallization layer arrangement.

Next and as shown in FIG. 26, the dielectric material for the metallization layer 8 is applied over the dielectric layer 187 and the remaining multitude of processing steps to fabricate the metallization layer can be performed. Typically these will be the types of processing steps utilized to fabricate metallization layers without any air gaps 185a, 185b and 185c such as those processing steps used to fabricate, for example, the metallization layer 75. The metallization layers 70 and 75, the etch stop 213, the dielectric layer 187 and the ILDs 195, and 205 remain unaffected by these processing steps.

Figure 28:
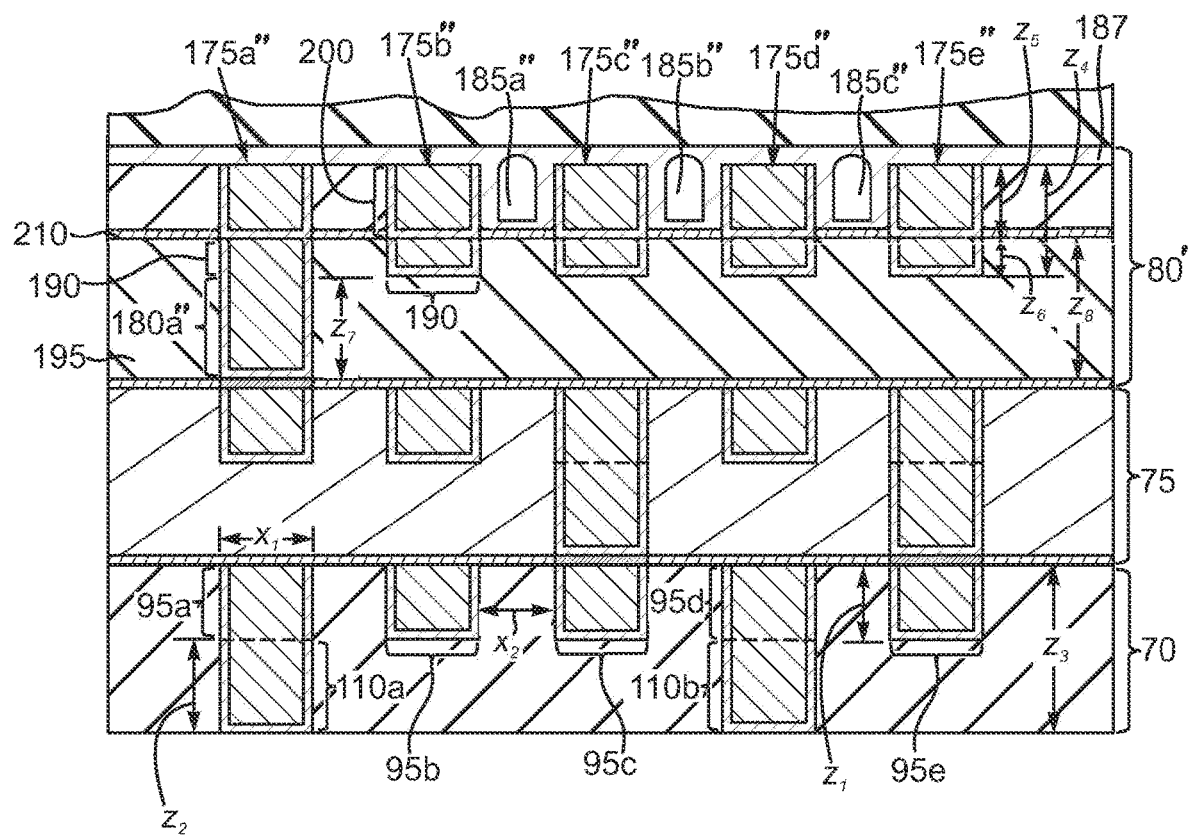
FIG. 28 is a sectional view like FIG. 3, but depicting another alternate exemplary metallization layer arrangement for a semiconductor chip.

As noted above, the dimensions of the ILDs and conductor lines and vias for an air gap metallization layer can be tailored to achieve certain levels of capacitance and resistance. For example, FIG. 28 is a sectional view like FIG. 3, but of an alternate exemplary metallization layer 80' that utilizes the same basic single damascene on double damascene processing to establish conductive lines and vias. But in this exemplary arrangement, different multipliers can be used to change the spatial relationships of the various conductor structures. In this illustrative arrangement, the process is tailored to make the thicknesses $z_4$ of the conductor lines 17 Sa', 175b', 175c' and 175d' 2.0 times thicker than the thickness $z$, of conductor lines 95a, 95b, 95c, 95d and 95e of the metallization layer 70 and the height $z_7$ of the vias 180a' the same as the height $z_2$ of the vias 110a and 110b. The same basic line width x can be used. Table 2 below illustrate some exemplary parameters.

TABLE 2

| Parameter | Multiplier | Multiplier Value | Relationship |
|---|---|---|---|
| $z_4$ | $k_1$ | 2.0 | $z_4 = 2z_1$ |
| $z_5$ | $k_2$ | 1.0 | $z_5 = 1.0z_1$ |
| $z_6$ | $k_3$ | 1.0 | $z_6 = 1.0z_1$ |
| $z_7$ | $k_4$ | 1.0 | $z_7 = 1.0z_2$ |

It should be understood that the multipliers $k_1$, $k_2$, $k_3$ and $k_4$ can take on a variety of values. The thickness $z_8$ of the ILD 195 can be tailored to accommodate the thicknesses $z_4$ $z_5$, $z_6$ and the height $z_7$. The air gaps 185a', 185b' and 185c' in the dielectric layer 187 will be taller and the ILD 195 etched deeper between the lines 175a' and 175b' and so on than the arrangement shown in FIG. 3. The same basic stacked line structure using first line portions 190 and second line portions 200 is used, albeit with appropriate thicknesses. Note that the aspect ratios of the conductor lines 175a', 175b', 175c' and 175d' can be larger than for the metallization layer 70.

In another alternative illustrative arrangement depicted in FIG. 28, the process is tailored to make the thicknesses $z_4$ of the conductor lines 175a", 175b", 175c'1, 175d" and 175e" of a metallization layer 80" 1.5 times thicker than the thicknesses of conductor lines 95a, 95b, 95c, 95d and 95e of the metallization layer 70 and the height of the vias 180a" 2.0 times higher than the vias 110a, 140a, etc. However, it should be understood that the multipliers $k_1$, $k_2$, $k_3$ and $k_4$ can take on a variety of values. Table 3 below illustrate some exemplary parameters.

TABLE 3

| Parameter | Multiplier | Multiplier Value | Relationship |
|---|---|---|---|
| $z_4$ | $k_1$ | 1.5 | $z_4 = 1.5z_1$ |
| $z_5$ | $k_2$ | 1.5 | $z_5 = z_1$ |
| $z_6$ | $k_3$ | 0.5 | $z_6 = 0.5z_1$ |
| $z_7$ | $k_4$ | 2.0 | $z_7 = 2.0z_2$ |

The thickness $z_8$ of the ILD 195 can be tailored to accommodate the thicknesses $z_4$, $z_5$, $z_6$ and the height $z_7$. The air gaps 185a", 185b" and 185c" in the dielectric layer 187 will be shorter than and the ILD 195 not etched between the lines 175a" and 175b[1] and so on as in the arrangement shown in FIG. 3. Indeed, the etch stop layer 210 sets the lower limit of the dielectric layer 187 where the air gaps 185a", 185b" and 185c" form. The same basic stacked line structure using first line portions 190 and second line portions 200 is used, albeit with appropriate thicknesses. Note that the aspect ratios of the conductor lines 175a", 175b", 175c", 175d" and 175e" can be larger than for the metallization layer 70.

Figure 29:
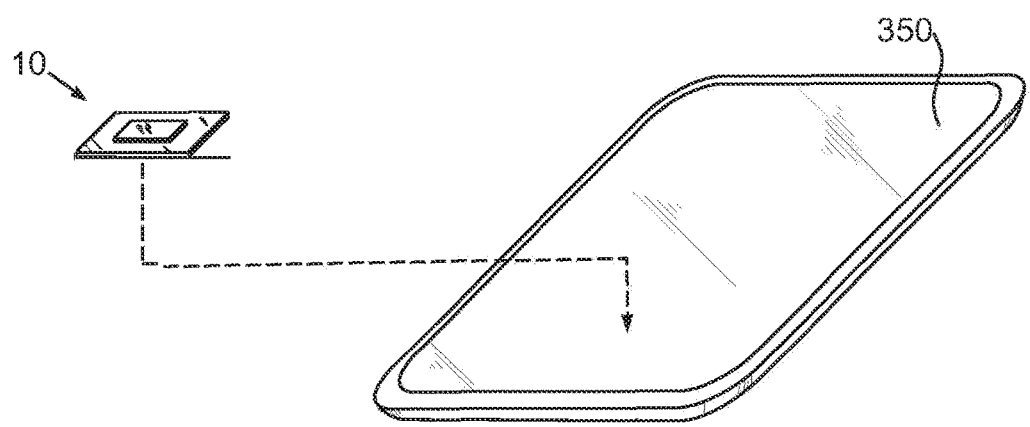
FIG. 29 is a pictorial view of an electronic device with a semiconductor chip device exploded therefrom.

Any of the disclosed semiconductor chip arrangements can be placed in an electronic device. FIG. 29 shows the semiconductor chip device 10 exploded from an electronic device 350, which can be may be a computer, a digital television, a handheld mobile device, a personal computer, a server, a memory device, an add-in board such as a graphics card, or any other computing device employing semiconductors.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A semiconductor chip, comprising:
   a first metallization layer on a substrate and a second metallization layer on the first metallization layer;
   plural conductor lines in the first metallization layer, each of the conductor lines having an aspect ratio;
   a first conductor line in the second metallization layer and a second conductor line in the second metallization layer in spaced apart relation to the first conductor line, each of the first conductor line and the second conductor line having an aspect ratio greater than the aspect ratios of the plural conductor lines; and
   a dielectric layer having a portion positioned between the first conductor line and the second conductor line, the portion having an air gap.

2. The semiconductor chip of claim 1, wherein:
   each of the first conductor line and the second conductor line has a first line portion and a second line portion stacked on the first line portion; and
   a third conductor line of the second metallization layer comprises a first line portion and a second line portion stacked on the first line portion of the third conductor line, the second metallization layer having a conductive via, the first line portion of the third conductor line and the conductive via having a shared contiguous bulk conductor portion and a shared contiguous barrier layer.

3. The semiconductor chip of claim 1, comprising plural conductive vias in the first metallization layer, each of the plural conductive vias having a first thickness, a third conductor line of the second metallization layer comprising a first line portion and a second line portion stacked on the first line portion of the third conductor line, the second metallization layer having a conductive via connected to the first line portion of the third conductor line, the conductive via having a second thickness greater than the first thickness.

4. The semiconductor chip of claim 1, wherein the second metallization layer comprises a first dielectric layer and a second dielectric layer stacked on the first dielectric layer, each of the first conductor line and the second conductor line being positioned partially in the first dielectric layer and partially in the second dielectric layer.

5. The semiconductor chip of claim 1, wherein the plural conductor lines having a first lateral spacing, the first conductor line and the second conductor line of the second metallization layer having a second lateral spacing smaller than the first lateral spacing.

6. The semiconductor chip of claim 1, comprising a circuit board, the semiconductor chip being mounted on the circuit board.

7. A method of manufacturing a semiconductor chip, comprising:
fabricating a first conductor line in one of a plurality of metallization layers and a second conductor line in the one of the plurality of metallization layers in spaced apart relation to the first conductor line; and
fabricating a dielectric layer having a portion positioned between the first conductor line and the second conductor line, the portion having an air gap.

8. The method of claim 7, wherein:
the fabricating of the first conductor line and the second conductor line further comprises fabricating each of the first conductor line and the second conductor line to have a first line portion and a second line portion stacked on the first line portion; and
the method further comprises fabricating a third conductor line in the one of the metallization layers with a first line portion and a second line portion stacked on the first line portion of the third conductor line, and fabricating a conductive via in the one of metallization layers, the first line portion of the third conductor line and the conductive via having a shared contiguous bulk conductor portion and a shared contiguous barrier layer.

9. The method of claim 7, further comprising:
wherein the fabricating of the first conductor line and the second conductor line further comprises fabricating each of the first conductor line and the second conductor line to have a first line portion and a second line portion stacked on the first line portion, wherein the second line portion of the first conductor line has a first thickness and the air gap has a second thickness greater than the first thickness.

10. The method of claim 7, comprising fabricating plural conductor lines in another of the metallization layers, each of the plural conductor lines having a first thickness, the first conductor line of the one metallization layer having a second thickness greater than the first thickness.

11. The method of claim 7, comprising fabricating plural conductive vias in another of the metallization layers, each of the plural conductive vias having a first thickness, and fabricating a third conductor line of the one of the metallization layers with a first line portion and a second line portion stacked on the first line portion of the third conductor line, the one of the metallization layers having a conductive via connected to the first line portion of the third conductor line, the conductive via having a second thickness greater than the first thickness.

12. The method of claim 7, wherein the one of the metallization layers comprises a first dielectric layer and a second dielectric layer stacked on the first dielectric layer, each of the first conductor line and the second conductor line being positioned partially in the first dielectric layer and partially in the second dielectric layer.

13. The method of claim 7, comprising fabricating plural conductor lines in another of the metallization layers, the plural conductor lines having a first lateral spacing, the first conductor line and the second conductor line of the one metallization layer having a second lateral spacing smaller than the first lateral spacing.

14. The method of claim 7, comprising mounting the semiconductor chip on a circuit board.

15. A method of manufacturing a semiconductor chip, comprising:
fabricating a first metallization layer on a substrate and a second metallization layer on the first metallization layer;
fabricating plural conductor lines in the first metallization layer, each of the conductor lines having an aspect ratio;
fabricating a first conductor line in the second metallization layer and a second conductor line in the second metallization layer in spaced apart relation to the first conductor line, each of the first conductor line and the second conductor line having a first line portion and a second line portion stacked on the first line portion, each of the first conductor line and the second conductor line having an aspect ratio greater than the aspect ratios of the plural conductor lines; and
fabricating a dielectric layer having a portion positioned between the first conductor line and the second conductor line, the portion having an air gap.

16. The method of claim 15, further comprising:
fabricating a third conductor line of the second metallization layer, the fabricating of the third conductor line of the second metallization layer including fabricating a first line portion and a second line portion stacked on the first line portion of the third conductor line; and
fabricating a conductive via in the second metallization layer having, wherein the first line portion of the third conductor line and the conductive via have a shared contiguous bulk conductor portion and a shared contiguous barrier layer.

17. The method of claim 15 further comprising:
fabricating plural conductive vias in the first metallization layer, each of the plural conductive vias having a first thickness;
fabricating a third conductor line of the second metallization layer including fabricating a first line portion and a second line portion stacked on the first line portion of the third conductor line; and
fabricating a conductive via in the second metallization layer, wherein the conductive via is connected to the first line portion of the third conductor line and has a second thickness greater than the first thickness.

18. The method of claim 15, wherein the second metallization layer comprises a first dielectric layer and a second dielectric layer stacked on the first dielectric layer, each of the first conductor line and the second conductor line being positioned partially in the first dielectric layer and partially in the second dielectric layer.

19. The method of claim 15, wherein:
fabricating the plural conductor lines in the first metallization layer further comprises fabricating the plural conductor lines to have a first lateral spacing, and
fabricating the first conductor line and the second conductor line of the second metallization layer further comprises fabricating the first conductor line and the second conductor line to have a second lateral spacing smaller than the first lateral spacing.

20. The method of claim 15, comprising mounting the semiconductor chip on a circuit board.

* * * * *